United States Patent
Oie et al.

(10) Patent No.: US 12,531,182 B2
(45) Date of Patent: Jan. 20, 2026

(54) ELECTRONIC COMPONENT

(71) Applicant: Murata Manufacturing Co., Ltd., Kyoto (JP)

(72) Inventors: Hirofumi Oie, Nagaokakyo (JP); Masahiro Teramoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 182 days.

(21) Appl. No.: 18/610,460

(22) Filed: Mar. 20, 2024

(65) Prior Publication Data

US 2024/0221995 A1 Jul. 4, 2024

Related U.S. Application Data

(63) Continuation of application No. PCT/JP2022/035327, filed on Sep. 22, 2022.

(30) Foreign Application Priority Data

Sep. 24, 2021 (JP) .................................. 2021-156006

(51) Int. Cl.
*H01F 27/28* (2006.01)
*H01F 27/29* (2006.01)
(Continued)

(52) U.S. Cl.
CPC ....... *H01F 27/2885* (2013.01); *H01F 27/292* (2013.01); *H01F 27/40* (2013.01); *H03H 7/00* (2013.01)

(58) Field of Classification Search
CPC .... H01F 27/2885; H01F 27/292; H01F 27/40; H03H 7/00
See application file for complete search history.

(56) References Cited

U.S. PATENT DOCUMENTS 5,521,564 A * 5/1996 Kaneko ............... H01P 1/20372
 333/202
11,335,496 B2 * 5/2022 Kang ..................... H01F 27/288
(Continued)

FOREIGN PATENT DOCUMENTS

JP 2002-057543 A 2/2002
JP 2004-128135 A 4/2004
(Continued)

OTHER PUBLICATIONS

International Search Report for PCT/JP2022/035327 dated Dec. 20, 2022.

*Primary Examiner* — Scott Bauer
(74) *Attorney, Agent, or Firm* — McDonald Hopkins LLC

(57) ABSTRACT

To provide an electronic component capable of improving the adhesiveness of the shield conductor provided on the outer surface of the substrate body, to the substrate body, while suppressing a deterioration of the characteristics of an LC resonator provided in the substrate body. An electronic component comprises substrate body that includes substrates being insulating and laminated, and that has principal surfaces and side surface, LC resonator that includes inductor conductor disposed on substrates and capacitor conductor disposed on substrates and electrically connected to the inductor conductor, shield conductor that is disposed on principal surface and that is electrically connected to a ground, outer electrode that is disposed on principal surfaces and that is electrically connected to the LC resonator, and protective layer that covers shield conductor disposed on principal surface and principal surface, in a manner straddling interface between shield conductor disposed on principal surface and substrate body.

20 Claims, 23 Drawing Sheets

(51) Int. Cl.
    *H01F 27/40*     (2006.01)
    *H03H 7/00*     (2006.01)

(56) References Cited

U.S. PATENT DOCUMENTS

| | | |
|---|---|---|
| 11,367,561 B2 * | 6/2022 | Lim .................... H01F 17/0013 |
| 11,587,722 B2 * | 2/2023 | Yang ....................... H01F 17/04 |
| 2002/0057139 A1 | 5/2002 | Matsumura et al. |
| 2007/0001786 A1 | 1/2007 | Kundu |
| 2013/0341080 A1 | 12/2013 | Otsubo |
| 2018/0315545 A1 | 11/2018 | Kusumoto et al. |
| 2019/0198230 A1 | 6/2019 | Miyahara et al. |
| 2020/0035404 A1 * | 1/2020 | Lim .................... H01F 17/0013 |

FOREIGN PATENT DOCUMENTS

| | | |
|---|---|---|
| JP | 2004-303946 A | 10/2004 |
| JP | 4579198 B2 | 11/2010 |
| JP | 2018-186205 A | 11/2018 |
| WO | 2012/132880 A1 | 10/2012 |
| WO | 2018/047488 A1 | 3/2018 |

\* cited by examiner

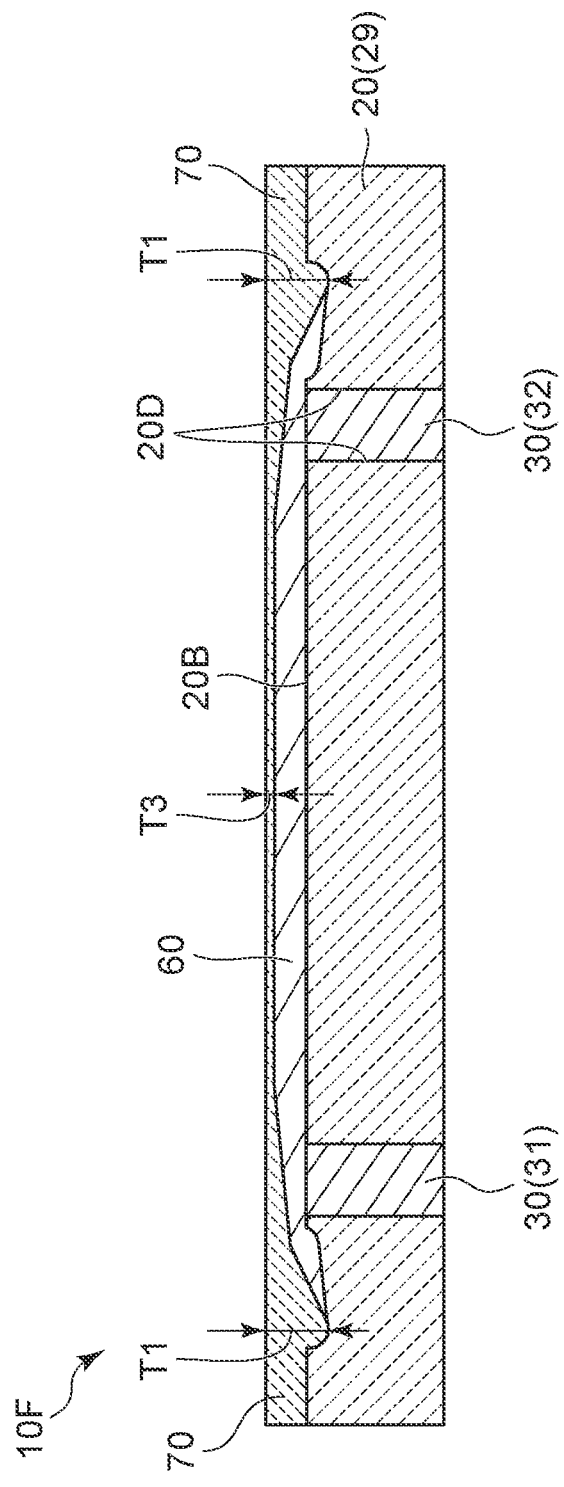

ELECTRONIC COMPONENT

CROSS REFERENCE TO RELATED APPLICATION

This is a continuation of International Application No. PCT/JP2022/035327 filed on Sep. 22, 2022 which claims priority from Japanese Patent Application No. 2021-156006 filed on Sep. 24, 2021. The contents of these applications are incorporated herein by reference in their entireties.

BACKGROUND OF THE DISCLOSURE

Field of the Disclosure

The present disclosure relates to an electronic component including a substrate body and a shield formed on an outer surface of the substrate body.

Description of the Related Art

An electronic component including a shield on the outer surface of the substrate body is disclosed in Patent Document 1.

A laminated electronic component disclosed in Patent Document 1 includes a laminate that includes a plurality of laminated dielectric layers. The laminate also includes an inductor and a capacitor.

In the laminated electronic component disclosed in Patent Document 1, a shield is provided on the laminate. The shield reduces the effect of electromagnetic noise, e.g., that from external of the laminated electronic component, on the inductor and the capacitor. The shield is formed on the laminate using sputtering.

Patent Document

Patent Document 1: JP-A-2018-186205

BRIEF SUMMARY OF THE DISCLOSURE

When sputtering is used to form the shield on the laminate, factors such as surface roughness of the laminate and the material of the laminate affect the adhesiveness between the shield and the laminate. It means that, depending on the surface roughness of the laminate and the material of the laminate, the adhesiveness between the shield and the laminate may be deteriorate. When the adhesion between the shield and the laminate is weak, although it may be possible to maintain the adhesion between the shield and the laminate at the initial stage immediately after the shield is formed on the laminate, it is highly likely that, when the electronic component is subjected to thermal shock, for example, later in time, the shield will peel off from the laminate.

The laminated electronic component disclosed in Patent Document 1 also includes an inductor. In the laminated electronic component disclosed in Patent Document 1, the shield covers the top surface and the side surfaces of the laminate. The shield has a high electromagnetic-noise shielding property. The shield therefore may shield the magnetic flux generated by the inductor, and cause a deterioration of the inductor characteristics.

A possible benefit of the present disclosure is to solve the problems described above, and is to provide an electronic component capable of improving the adhesiveness of the shield conductor provided on the outer surface of the substrate body, to the substrate body, while suppressing a deterioration of the characteristics of an LC resonator provided in the substrate body.

In order to achieve the possible benefit described above, the present disclosure is configured as follows.

An electronic component according to one aspect of the present disclosure includes: a substrate body that includes a plurality of substrates being insulating and laminated in a thickness direction, and that has a pair of principal surfaces facing each other and a side surface connecting the pair of principal surfaces; an LC resonator that includes an inductor conductor disposed on at least one of the plurality of substrates, and a capacitor conductor disposed on at least one of the plurality of substrates and electrically connected to the inductor conductor; a shield conductor that is disposed on at least one principal surface, among the pair of principal surfaces and the side surface, and that is electrically connected to a ground; an electrode that is disposed on at least one of another one of the pair of principal surfaces and the side surface, and that is electrically connected to the LC resonator; and a protective layer that covers at least a part of the shield conductor disposed on the one principal surface, out of the pair of principal surfaces, and also covers at least a part of the one principal surface, in a manner straddling at least a part of an interface between the shield conductor disposed on the one principal surface and the substrate body, in a view from a thickness direction.

According to the present disclosure, it is possible to improve the adhesiveness of the shield conductor provided on the outer surface of the substrate body, to the substrate body, while suppressing the deterioration of characteristics of the LC resonator provided in the substrate body.

BRIEF DESCRIPTION OF THE SEVERAL VIEWS OF THE DRAWINGS

FIG. 23 is a cross-sectional view showing a part of an electronic component according to a sixth embodiment of the present disclosure.

DETAILED DESCRIPTION OF THE DISCLOSURE

Figure 1:
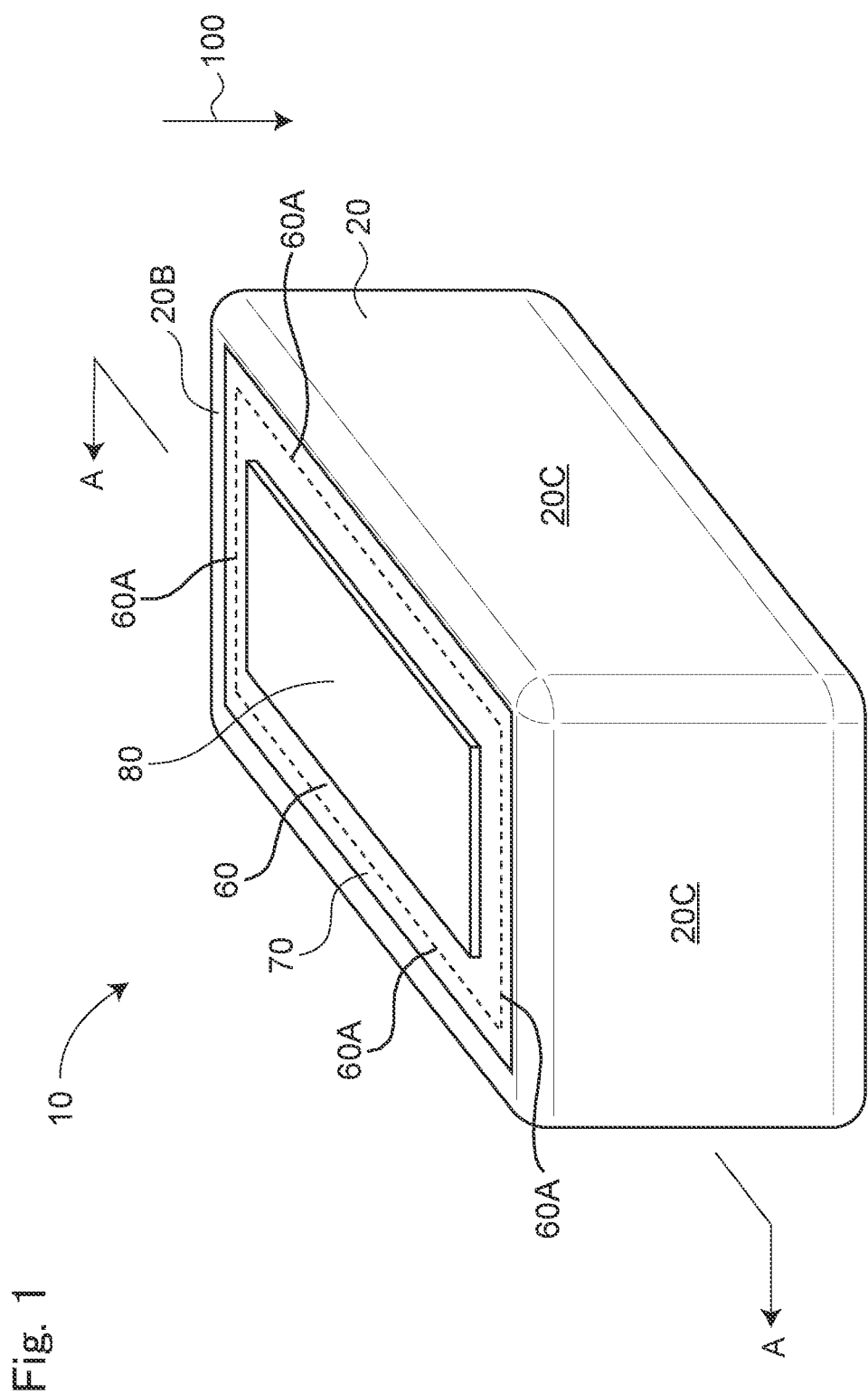
FIG. 1 is a perspective view of an electronic component according to a first embodiment of the present disclosure.

An electronic component according to one aspect of the present disclosure includes: a substrate body that includes a plurality of substrates being insulating and laminated in a thickness direction, and that has a pair of principal surfaces facing each other and a side surface connecting the pair of principal surfaces; an LC resonator that includes an inductor conductor disposed on at least one of the plurality of substrates, and a capacitor conductor disposed on at least one of the plurality of substrates and electrically connected to the inductor conductor; a shield conductor that is disposed on at least one principal surface, among the pair of principal surfaces and the side surface, and that is electrically connected to a ground; an electrode that is disposed on at least one of another one of the pair of principal surfaces and the side surface, and that is electrically connected to the LC resonator; and a protective layer that covers at least a part of the shield conductor disposed on the one principal surface, out of the pair of principal surfaces, and also covers at least a part of the one principal surface, in a manner straddling at least a part of an interface between the shield conductor disposed on the one principal surface and the substrate body, in a view from a thickness direction.

In this configuration, the protective layer covers the shield conductor in a manner straddling the interface between the shield conductor and the substrate body. This protective layer can therefore reinforce the adhesiveness of the shield conductor to the substrate body.

In this configuration, the electronic component includes an LC resonator. The shield conductor is provided on at least one principal surface of the pair of principal surfaces, among the outer surfaces of the substrate body. Therefore, it is possible to achieve an electronic component in which at least one of the other principal surface of the pair of principal surfaces and the side surfaces does not have any shield conductor. With this, less magnetic flux from the LC resonator is shielded by the shield conductor.

In the electronic component, the part of the shield conductor, the part being covered by the protective layer, may be nipped between the protective layer and the substrate body, in internal of the substrate body.

With this configuration, the part of the shield conductor, the part being covered by the protective layer, is embedded in the substrate body by being pressed by the protective layer, and nipped between the substrate body and the protective layer. As a result, the adhesiveness of the shield conductor to the substrate body can be enhanced.

In the electronic component described above, the interface between the shield conductor disposed on the one principal surface and the substrate body may include a first interface and a second interface with the shield conductor between the first interface and the second interface in a view from the thickness direction, wherein the protective layer may include a first portion straddling the first interface, a second portion straddling the second interface, and a third portion connecting the first portion and the second portion in a manner traversing across the shield conductor between the first interface and the second interface, in a view from the thickness direction.

With this configuration, the third portion of the protective layer is provided in a manner traversing across the shield conductor. As a result, the adhesiveness of the shield conductor to the substrate body can be enhanced.

The electronic component may also include an interlayer-connection conductor that penetrates the substrate on which the shield conductor is disposed, among the plurality of substrates, and the shield conductor may be electrically connected to the ground via the interlayer-connection conductor.

In a conventional configuration, for example, an internal conductor disposed on a principal surface of a substrate located internal of the substrate body is electrically connected to a shield conductor that is provided on a side surface of the substrate body, on the side edge of the substrate. In this configuration, the thickness of the internal conductor determines the area by which the internal conductor is brought into contact with the shield conductor. It is however difficult to increase the thickness of the internal conductor. It is therefore difficult to increase the area by which the internal conductor is brought into contact with the shield conductor.

By contrast, in the present configuration, the interlayer-connection conductor provided internal of the substrate is electrically connected to the shield conductor. In this configuration, the diameter of a via filled with the interlayer-connection conductor internal of the substrate determines the area by which the interlayer-connection conductor is brought into contact with the shield conductor. It is easier to increase the diameter of a via, than to increase the thickness of the internal conductor. It is therefore easier to increase the area by which the interlayer-connection conductor is brought into contact with the shield conductor, than to increase the area by which the internal conductor is brought into contact with the shield conductor. Therefore, the reliability of the connection between the interlayer-connection conductor and the shield conductor can be improved.

The electronic component may also include a plurality of the interlayer-connection conductors provided in the substrate on which the shield conductor is disposed, among the plurality of substrates, and the shield conductor may be electrically connected to the ground via the plurality of the interlayer-connection conductors.

In this configuration, it is possible to electrically connect a larger number of the interlayer-connection conductors to the shield conductor. By electrically connecting a larger number of interlayer-connection conductors to the shield conductor, unnecessary resonance in the LC resonator can be suppressed.

In the electronic component, at least one of the interlayer-connection conductors may be positioned in an outer peripheral portion of the shield conductor, in a view from the thickness direction, and the protective layer may be disposed at a position overlapping with at least a part of the interlayer-connection conductor in a manner straddling the interlayer-connection conductor and the shield conductor, in a view from the thickness direction.

With the configuration in which the interlayer-connection conductor is provided in the outer peripheral portion of the shield conductor, in a view from the thickness direction, during the process of firing the substrate body, the outer peripheral portion of the shield conductor may rise from the substrate body, because of the contraction of a substrate or the outgas from the interlayer-connection conductors, for example. With the present configuration, however, the protective layer is provided immediately on top of the interlayer-connection conductor, which is covered by the outer peripheral portion of the shield conductor, in a view from the thickness direction. As a result, the protective layer can suppress rising of the outer peripheral portion of the shield conductor from the substrate body.

In the electronic component, the shield conductor may be provided on one of the pair of principal surfaces, without providing the shield conductor on the other one of the pair of principal surfaces and the side surfaces.

The electronic component includes an LC resonator. In the present configuration, the shield conductor is provided only on one of the pair of principal surfaces of the outer surface of the substrate body. With this, less magnetic flux from the LC resonator is shielded by the shield conductor.

If the shield conductor is provided on the side surfaces of the substrate body, as well as on one of the pair of principal surfaces of the substrate body, the magnetic flux of the LC resonator is shielded by the shield conductor disposed on the side surfaces of the substrate body. Therefore, the position where the LC resonator can be disposed would be limited to a position offset from the side surfaces of the substrate body, e.g., at the center portion of the substrate body in a view from the thickness direction. In the present configuration, because the shield conductor is not provided on the side surfaces of the substrate body, it is possible to dispose the LC resonator near the side surfaces of the substrate body. That is, there is no limitation on where the LC resonator is disposed, such as that described above.

In the electronic component, an internal circuit including the LC resonator may be provided on at least one of the plurality of substrates, and the protective layer may be provided, in a view in the thickness direction, at a position offset from a closest element of the internal circuit, the closest element being closest in the thickness direction to the one of the pair of principal surfaces.

Within the shield conductor, a part covered by the protective layer is highly likely to be pressed by the protective layer, and dig into the substrate body. If the internal circuit is provided near immediately below such a part of the shield conductor, such a part of the shield conductor would come near the internal circuit in the thickness direction, and a high parasitic capacitance would be generated between the part of the shield conductor and the internal circuit. With the present configuration, however, the protective layer is provided, in a view from the thickness direction, at a position offset from an element of the internal circuit, the element being closest to the one principal surface, out of the pair of principal surfaces, in the thickness direction. In this manner, it is possible to suppress the reduction in the distance between the shield conductor and the internal circuit in the thickness direction. As a result, it becomes possible to suppress generation of a high parasitic capacitance between the shield conductor and the internal circuit.

In the electronic component, an identification mark may be provided on a surface of the shield conductor provided on the one principal surface, out of the pair of principal surfaces.

In this configuration, the identification mark is provided on the surface of the shield conductor. Therefore, the visibility of the identification mark can be improved, compared with a configuration in which the identification mark is covered by the shield conductor.

In the electronic component, the identification mark may be made of a material that is the same as a material of the protective layer.

If the material of the identification mark is different from the material of the protective layer, the process for forming the identification mark on the surface of the shield conductor and the process of forming the protective layer on the surface of the shield conductor are carried out as separate processes. With the present structure, by contrast, the identification mark and the protective layer can be formed simultaneously by printing or the like, on the surface of the shield conductor. As a result, it is possible to reduce the steps for manufacturing the electronic component.

In the electronic component, at least a part of the protective layer provided in a neighboring portion around the interface between the shield conductor disposed on the one principal surface and the substrate body in a view from the thickness direction may be thicker in the thickness direction than the shield conductor provided on one of the pair of principal surfaces.

With this configuration, the protective layer is enabled to press the shield conductor deeper into the substrate body. As a result, the adhesiveness of the shield conductor to the substrate body can be enhanced.

First Embodiment

Figure 2:
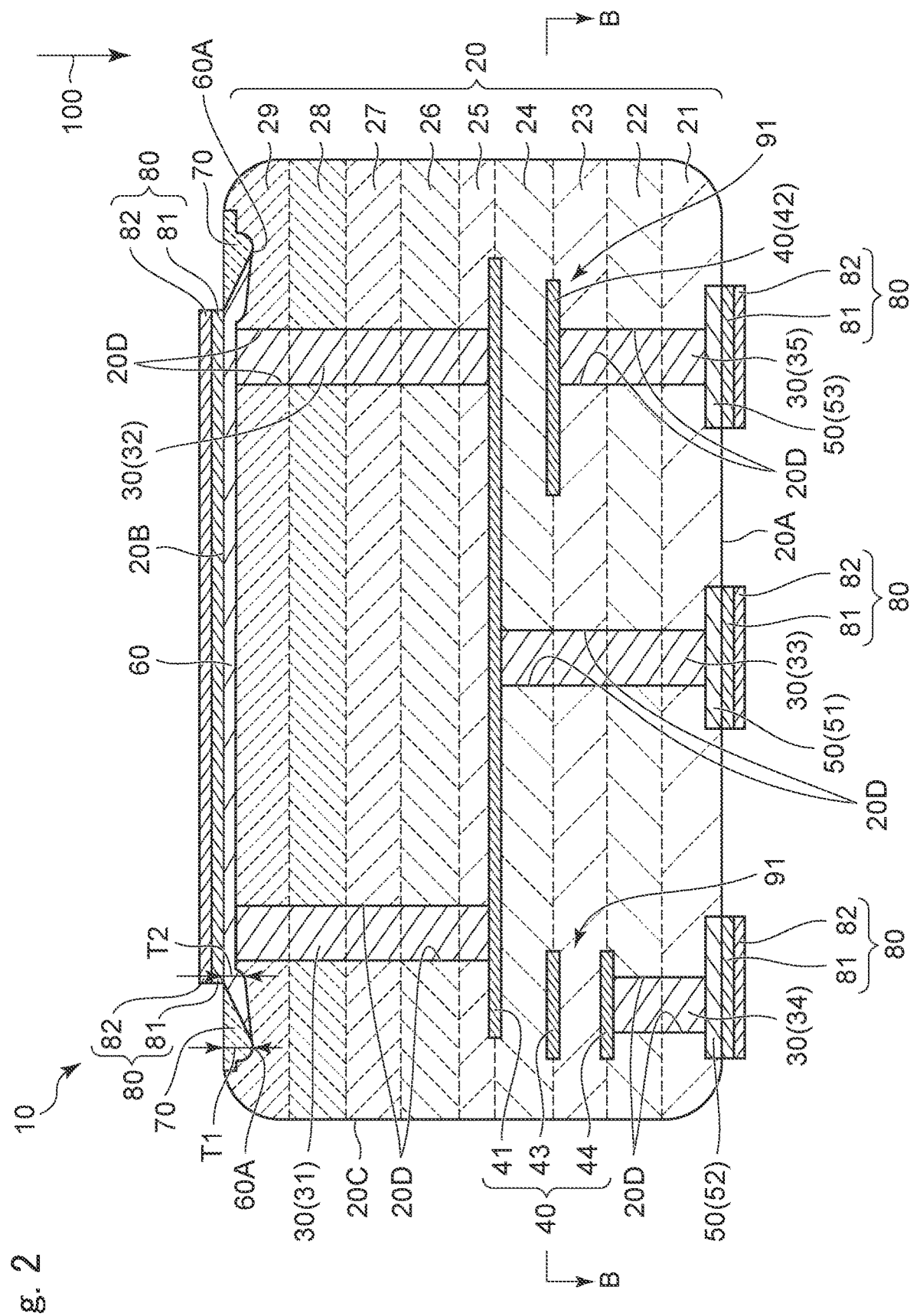
FIG. 2 is a cross-sectional view showing the cross section A-A in FIG. 1.

FIG. 1 is a perspective view of an electronic component according to a first embodiment of the present disclosure. FIG. 2 is a cross-sectional view showing the cross section A-A in FIG. 1. The electronic component includes a substrate body on which a shield conductor is disposed, and a protective layer covering at least a part of the shield conductor. In the electronic component according to the first embodiment, the substrate body includes an internal electrode and an external electrode, in addition to the shield conductor and the protective layer. The electronic component may be mounted on a mother board or the like, via an external electrode.

As shown in FIGS. 1 and 2, such an electronic component 10 according to the first embodiment includes a substrate body 20, interlayer-connection conductors 30, internal electrodes 40, external electrodes 50, a shield conductor 60, a protective layer 70, and a plating layer 80.

The substrate body 20 has a cuboid shape as a whole. The shape of the substrate body 20 is, however, not limited to a cuboid shape. In the first embodiment, the substrate body 20 is an integration of substrates 21 to 29 that are stacked in the thickness direction 100. That is, in the first embodiment, the substrate body 20 is an integration of nine substrates. The number of substrates included in the substrate body 20 is not limited to nine. Each of the substrates 21 to 29 is insulating, and has a plate-like shape. In the first embodiment, the substrate body 20 (the substrates 21 to 29) is made of low temperature co-fired ceramic (LTCC). The substrate body 20 is not limited to an LTCC, and may be made of ceramic other than an LTCC such as alumina, or may be made of resin such as glass epoxy, Teflon (registered trademark), or paper phenol.

As shown in FIG. 2, the substrate body 20 includes a pair of principal surfaces 20A, 20B and a side surface 20C. A principal surface 20A is a principal surface of the substrate 21, on the side facing external of the substrate body 20. A principal surface 20B is a principal surface of a substrate 29, on the side facing external of the substrate body 20. The principal surface 20B faces the opposite side of the principal surface 20A. The side surface 20C is configured by side surfaces of the substrates 21 to 29. The side surface 20C connects the principal surfaces 20A, 20B. In the first embodiment, the principal surface 20B corresponds to one of the pair of principal surfaces, and the principal surface 20A corresponds to the other of the pair of principal surfaces.

In the first embodiment, the pair of principal surfaces 20A, 20B is perpendicular to the thickness direction 100.

As shown in FIG. 2, the interlayer-connection conductor 30 is provided internal of the substrate body 20. The interlayer-connection conductor 30 may be formed in at least one of the substrates 21 to 29. In the first embodiment, the interlayer-connection conductor 30 is provided in the substrates 21 to 29.

The interlayer-connection conductor 30 is a conductive paste filled in a via 20D penetrating at least one of the plurality of substrates 21 to 29 in the thickness direction 100, and is co-fired with ceramic (LTCC in the first embodiment) that forms the substrate body 20. The conductive paste contains, for example, a conductive powder such as copper powder. The conductive powder contained in the conductive paste is not limited to copper, and may be silver, for example. When the substrate body 20 is made of resin, the interlayer-connection conductor 30 is made of a plated conductive metal such as copper. In the first embodiment, because the via 20D has a cylindrical shape, the interlayer-connection conductor 30 also has a cylindrical shape. The shape of the via 20D is not limited to a cylindrical shape, and may be, for example, a shape such as a quadrangular prism.

In FIG. 2, the interlayer-connection conductor 30 includes five interlayer-connection conductors 31 to 35. The interlayer-connection conductors 31, 32 are filled in vias 20D penetrating the substrate 25 to 29. The interlayer-connection conductor 33 is filled in the via 20D penetrating the substrate 21 to 24. The interlayer-connection conductor 34 is filled in the via 20D penetrating the substrates 21 and 22. The interlayer-connection conductor 35 is filled in the via 20D penetrating the substrate 21 to 23. The number of the interlayer-connection conductors 30 is not limited to five. The length of each of the interlayer-connection conductors 31 to 35 in the thickness direction 100 (the number of substrates the interlayer-connection conductor 31 to 35 penetrates) is not limited to the length described above.

Figure 3:
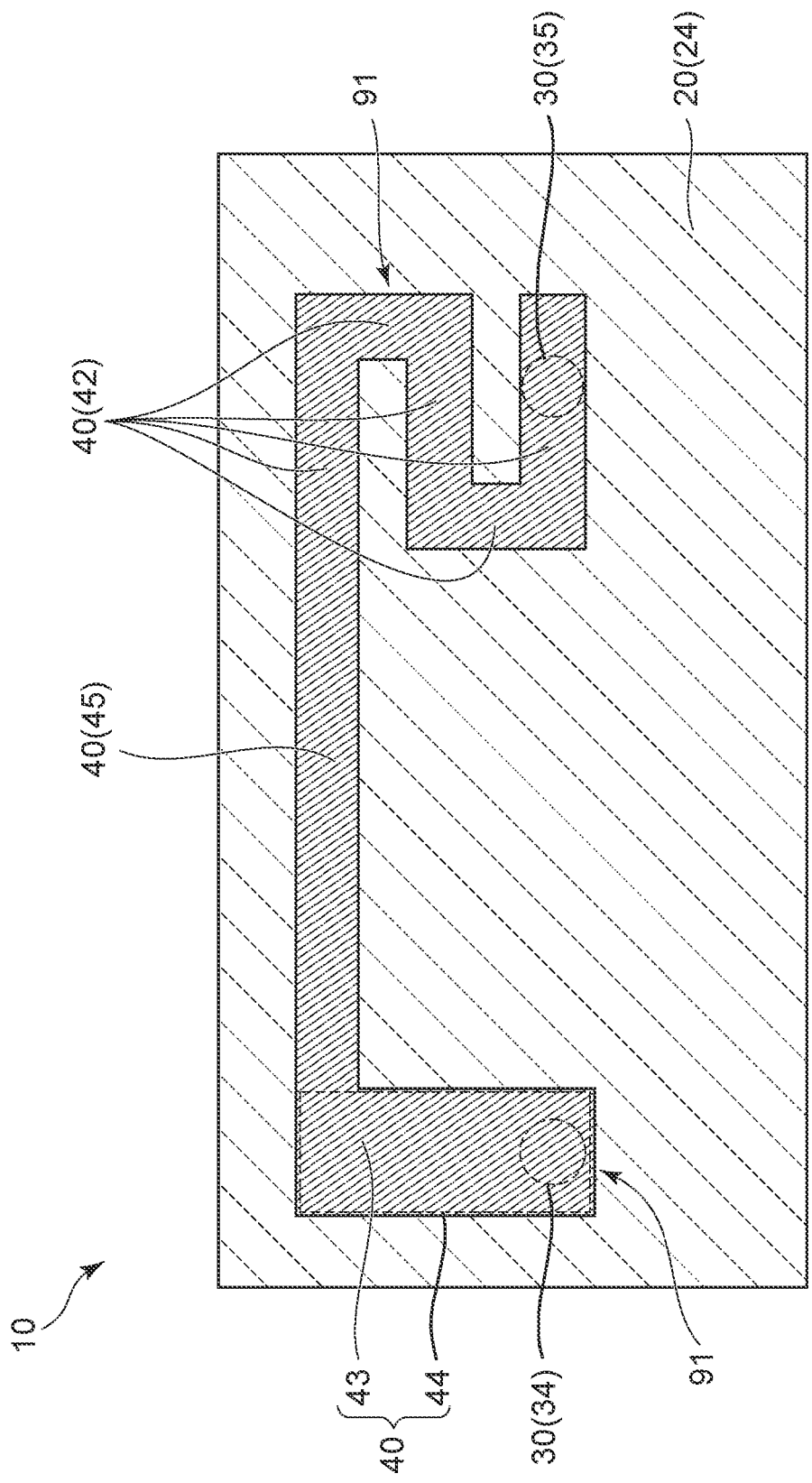
FIG. 3 is a cross-sectional view showing the cross section B-B in FIG. 2.

FIG. 3 is a cross-sectional view showing the cross section B-B in FIG. 2. As shown in FIGS. 2 and 3, the internal electrodes 40 are provided inside the substrate body 20, and are not exposed to the external of the substrate body 20. The internal electrodes 40 may be formed on at least one of the substrates 21 to 29. In the first embodiment, the internal electrodes 40 are provided on the respective substrates 23 to 25.

When the substrate body 20 is made of ceramic as in the first embodiment, the internal electrodes 40 are formed by printing a conductive paste on a principal surface of a substrate (the substrate 23 to 25 in the first embodiment) and co-firing the paste with the substrate. The conductive paste is made of copper or silver, for example. When the substrate body 20 is made of resin, the internal electrode 40 is provided on the principal surface of the substrate using a known technique such as etching of a metal foil.

In the first embodiment, the internal electrode 40 includes five internal electrodes 41 to 45. The internal electrode 41 is provided on the substrate 25. The internal electrodes 42, 43, and 45 are provided on the substrate 24 (see FIG. 3). The internal electrode 44 is provided on the substrate 23.

Each of the internal electrodes 40 is electrically connected to the other internal electrodes 40, the external electrode 50 (external electrodes 51, 52, 53), or to the shield conductor 60. In the first embodiment, as shown in FIG. 2, the internal electrode 41 is electrically connected to the shield conductor 60 via the interlayer-connection conductors 31, 32, and is electrically connected to an external electrode 51 via the interlayer-connection conductor 33. The internal electrode 42 is electrically connected to the external electrode 53 via the interlayer-connection conductor 35. As shown in FIG. 3, the internal electrodes 42 and 43 are electrically connected to each other via the internal electrode 45. As shown in FIG. 2, the internal electrode 44 is electrically connected to an external electrode 52 via the interlayer-connection conductor 34.

Each of the external electrodes 50 is provided external of the substrate body 20. That is, the external electrode 50 is exposed to the external of the substrate body 20. In the first embodiment, the external electrode 50 is provided on a principal surface of the substrate 21 (the principal surface 20A of the substrate body 20). Note that the external electrode 50 may also be provided on at least one of the principal surface 20B of the substrate body 20 and the side surface 20C of the substrate body 20, instead of the principal surface 20A of the substrate body 20 or in addition to the principal surface 20A of the substrate body 20.

The external electrode 50 is configured in the same manner as the internal electrode 40. That is, in the first embodiment, the external electrode 50 is formed by printing a conductive paste on the principal surface 20A of the substrate body 20 and co-firing the paste with the substrate 21 to 29. In the first embodiment, the external electrode 50 includes three external electrodes 51 to 53.

As mentioned earlier, the external electrode 51 is electrically connected to the internal electrode 41 via the interlayer-connection conductor 33; the external electrode 52 is electrically connected to the internal electrode 44 via the interlayer-connection conductor 34; and the external electrode 53 is electrically connected to the internal electrode 42 via the interlayer-connection conductor 35.

In the first embodiment, the external electrode 51 is electrically connected to the ground to be grounded. For example, the external electrode 51 is electrically connected to an electrode provided on another substrate on which the electronic component 10 is mounted, and having a ground potential (for example, a mother board).

As mentioned earlier, the external electrodes 52, 53 are electrically connected to the internal electrodes 42, 44, respectively. The internal electrode 42 serves as an inductor of the LC resonator 91, and the internal electrode 44 serves as a capacitor of the LC resonator 91, as will be described later. In other words, the external electrodes 52, 53 are electrically connected to the LC resonator 91, which will be described later. The external electrodes 52, 53 are examples of electrodes.

At least a part of the internal electrode 40 and at least a part of the interlayer-connection conductor 30 together form an LC resonator 91 including an inductor and a capacitor.

As shown in FIG. 3, the internal electrode 42 has a meandering shape, in a view from the thickness direction 100. The internal electrode 42 thus forms a meander coil, and functions as an inductor. The internal electrode 42 is an example of an inductor conductor.

As shown in FIG. 2, the internal electrodes 43, 44 face each other in the thickness direction 100, with the substrate 23 interposed therebetween. The internal electrodes 43, 44 thus form capacitors, and function as capacitors. The internal electrodes 43, 44 are examples of a capacitor conductor.

As shown in FIG. 3, the internal electrode 42 forming a coil and the internal electrode 43 forming a capacitor are electrically connected to each other via the internal electrode 45. That is, the internal electrode 42 to 45 together form the LC resonator 91 in which the coil and the capacitor are electrically connected.

In the first embodiment, as shown in FIG. 2, the inductor conductor (internal electrode 42) is formed on the substrate 24, and the capacitor conductor (internal electrodes 43, 44) is formed on the substrates 23, 24. However, the inductor conductor and the capacitor conductor may be formed on any substrates, among the substrates 21 to 29 included in the substrate body 20. That is, the inductor conductor and the capacitor conductors may be formed on at least one of the substrates 21 to 29 included in the substrate body 20.

As shown in FIGS. 1 and 2, the shield conductor 60 is disposed on the principal surface 20B of the substrate body 20. The shield conductor 60 is formed by printing, in the same manner as the internal electrodes 40 and the external electrodes 50. The way in which the shield conductor 60 is formed is, however, not limited to printing. For example, the shield conductor 60 may be formed by sputtering or vapor deposition.

The shield conductor 60 is conductive. Typically, at least a part of the shield conductor 60 is made of a metal. In the first embodiment, the shield conductor 60 is made of a conductive member such as copper. It is also possible for a part of the shield conductor 60 to be made of a conductive member. For example, the shield conductor 60 may be made of another material, such as resin, including a conductive material.

In the first embodiment, the shield conductor 60 is embedded in the substrate body 20. The shield conductor 60 therefore forms a part of the principal surface 20B in FIG. 2. Note that it is also possible for the shield conductor 60 not to be embedded in the substrate body 20.

The shield conductor 60 may have a multi-layer structure. For example, the shield conductor 60 may include an adhesive layer that is in contact with the substrate 29, a conductive layer that is in contact with the adhesive layer and that is made of a highly conductive metal, and an anti-rust layer that is in contact with the conductive layer and that prevents oxidation or corrosion of the conductive layer. The conductive layer has a function for shielding electromagnetic waves, and is made of, for example, copper (Cu), silver (Ag), or aluminum (Al). The adhesive layer is provided to enhance the adhesion between the substrate 29 and the conductive layer, and may be made of, for example, titanium (Ti), chromium (Cr), or stainless steel (SUS).

The shield conductor 60 shields the electromagnetic waves from external of the electronic component 10 via the principal surface 20B. With this, it is possible to reduce the effect of the external electromagnetic waves incident on the LC resonator 91 via the principal surface 20B. The shield conductor 60 also shields the electromagnetic waves emitted from the LC resonator 91 to the external, via the principal surface 20B. Therefore, it is possible to reduce of the effect of the electromagnetic waves emitted from the LC resonator 91, on other components external of the electronic component 10.

In the first embodiment, the shield conductor 60 is not provided on the outer peripheral portion of the principal surface 20B of the substrate body 20, in a view from the thickness direction 100. That is, in the first embodiment, the shield conductor 60 is provided on a part of the principal surface 20B of the substrate body 20.

As shown in FIG. 1, the protective layer 70, which will be described later, covers an outer part of the shield conductor 60, in a view from the thickness direction 100. On an outer side of the part covered by the protective layer 70, in a view from the thickness direction 100, the principal surface 20B of the substrate body 20 is exposed.

Note that the area not provided with the shield conductor 60 is not limited to the outer peripheral portion of the principal surface 20B of the substrate body 20, in a view from the thickness direction 100. For example, the area not provided with the shield conductor 60 may be at the center portion of the principal surface 20B of the substrate body 20, in a view from the thickness direction 100. It is also possible for the shield conductor 60 to be provided across the entire area of the principal surface 20B of the substrate body 20.

In the first embodiment, the shield conductor 60 is not provided on the principal surface 20A and the side surface 20C of the substrate body 20. Therefore, the magnetic flux of the inductor conductor (internal electrode 42) of the LC resonator 91 is not shielded in the principal surface 20A and the side surface 20C of the substrate body 20.

As shown in FIG. 2, the shield conductor 60 is electrically connected to the internal electrode 41 via the interlayer-connection conductors 31, 32. As mentioned earlier, the internal electrode 41 is electrically connected to the external electrode 51 via the interlayer-connection conductor 33, and the external electrode 51 is electrically connected to the ground. That is, the shield conductor 60 is electrically connected to the ground via the interlayer-connection conductors 31 to 33 and the internal electrode 41.

Note that the configuration for electrically connecting the shield conductor 60 to the ground is not limited to the configuration via the interlayer-connection conductors 31 to 33 and the internal electrode 41. For example, the shield conductor 60 may be electrically connected to an external ground via a wire, for example.

As shown in FIGS. 1 and 2, the protective layer 70 straddles an interface 60A. The interface 60A is a boundary between the shield conductor 60 disposed on the principal surface 20B of the substrate body 20 and the substrate 29 of the substrate body 20, in a view from the thickness direction 100. The substrate 29 of the substrate body 20 herein is a part of the substrate 29 not covered by the shield conductor 60, in a view from the thickness direction 100.

The protective layer 70 is provided on a neighboring portion neighboring the interface 60A. This neighboring portion neighboring the interface 60A includes the interface 60A and an area neighboring the interface 60A. Specifically, the neighboring portion neighboring the interface 60A is an area spanning from an outer peripheral portion of the shield conductor 60, which is on the inner side of the interface 60A, to a part of the substrate 29 nearby the interface 60A, on the outer side of the interface 60A in a view from the thickness direction 100.

In the first embodiment, the protective layer 70 straddles the entire interface 60A around the shield conductor 60, but may also straddle only a part of the interface 60A around the shield conductor 60.

In the first embodiment, the protective layer 70 covers only an outer peripheral portion of the shield conductor 60 that is on the principal surface 20B of the substrate body 20, that is, only covers a part of the shield conductor 60. It is however also possible for the protective layer 70 to cover the entire shield conductor 60 disposed on the principal surface 20B of the substrate body 20.

In the first embodiment, the protective layer 70 also covers a nearby part of the substrate 29 near the interface 60A, on the outer side of the shield conductor 60 in a view from the thickness direction 100, but does not cover a part of the substrate 29 on the outer side of the nearby part (does not cover an outer peripheral portion of the principal surface 20B of the substrate body 20). In other words, the protective layer 70 covers only a part of the substrate 29 on the outer side of the shield conductor 60 in a view from the thickness direction 100. However, it is also possible for the protective layer 70 to cover the entire outer part of the substrate 29, the outer part being outside the shield conductor 60 in a view from the thickness direction 100.

As shown in FIG. 2, the protective layer 70 has a part having a thickness T1 greater than a thickness T2 of the shield conductor 60 provided on the principal surface 20B. This part having the thickness T1 is disposed at a position overlapping with the interface 60A, in a view from the thickness direction 100. The thickness T1 is the thickness of the thickest portion of the protective layer 70. The thickness T2 is the thickness of the thickest portion of the shield conductor 60.

In the first embodiment, the protective layer 70 has a thickness greater than the thickness of the shield conductor 60 in the part overlapping with the interface 60A in a view from the thickness direction 100. The protective layer 70 may however, also have a thickness greater than that of the shield conductor 60 in any part of the neighboring portion neighboring the interface 60A. In other words, there is no limitation as to where the protective layer 70 has a thickness greater than the thickness of the shield conductor 60, as long as the protective layer 70 is thicker, in the thickness direction 100, than the shield conductor 60 disposed on the principal surface 20B, in at least a part of the neighboring portion neighboring the interface 60A. In the first embodiment, the thickness of the protective layer 70 is greatest in the part overlapping with the interface 60A in a view from the thickness direction 100, but the thickness of the protective layer 70 may also be the greatest in any part other than the part overlapping with the interface 60A, in a view from the thickness direction 100.

The protective layer 70 is formed by printing, in the same manner as the internal electrodes 40, the external electrodes 50, and the shield conductor 60. The way in which the protective layer 70 is formed is, however, not limited to printing. For example, the protective layer 70 may be formed by a transfer method, as will be described later.

In the first embodiment, the protective layer 70 is made of LTCC. In the first embodiment, the protective layer 70 is made of LTCC that is the same material as the substrate body 20. The material of the protective layer 70 is, however, not limited to LTCC. For example, the protective layer 70 may be made of a ceramic other than LTCC, or may be made of a material other than ceramic (e.g., a resin material such as polyimide). It is also possible to use a material different from that of the substrate body 20 for the protective layer 70.

The outer peripheral portion of the shield conductor 60, that is, the part of the shield conductor 60 covered by the protective layer 70 thrusts deeper in the substrate body 20 than the part other than the outer peripheral portion of the shield conductor 60. The outer peripheral portion of the shield conductor 60 is thus nipped between the substrate body 20 and the protective layer 70, in the internal of the substrate body 20.

As shown in FIG. 2, the plating layer 80 covers the external electrodes 50 and the shield conductor 60. The plating layer 80 reduces the effects of atmosphere, moisture, and the like, on the external electrodes 50 and the shield conductor 60. The plating layer 80 is a film made of Ni (nickel)-Sn (tin), or Ni (nickel)-electroless Au (gold), for example. In the first embodiment, the plating layer 80 includes an inner layer 81 made of nickel and an outer layer 82 made of gold. The inner layer 81 is provided on the surfaces of the external electrodes 50 and the shield conductor 60. The outer layer 82 is provided on the inner layer 81, on the side facing the opposite side of the external electrodes 50 and the shield conductor 60.

In the first embodiment, the plating layer 80 includes two layers (the inner layer 81 and the outer layer 82), but the plating layer 80 may also include one layer or three or more layers.

The plating layer 80 is formed on the surface of the metal material. Therefore, the plating layer 80 is not formed on the surface of the protective layer 70, which is formed of a nonmetallic material. As a result, the protective layer 70 is exposed to the external of the electronic component 10, without being covered by the plating layer 80.

According to the first embodiment, the protective layer 70 covers the shield conductor 60 in a manner straddling the interface 60A between the shield conductor 60 and the substrate body 20. The protective layer 70 can therefore reinforce the adhesiveness of the shield conductor 60 to the substrate body 20.

According to the first embodiment, the part of the shield conductor 60 covered by the protective layer 70 is embedded in the substrate body 20, by being pressed by the protective layer 70, and is nipped between the substrate body 20 and the protective layer 70. As a result, adhesiveness of the shield conductor 60 to the substrate body 20 can be enhanced.

In a conventional configuration, for example, an internal conductor disposed on a principal surface of a substrate located internal of the substrate body is electrically connected to a shield conductor that is provided on a side surface of the substrate body, on the side edge of the substrate. In this configuration, the thickness of the internal conductor determines the area by which the internal conductor is brought into contact with the shield conductor. It is however difficult to increase the thickness of the internal conductor. It is therefore difficult to increase the area by which the internal conductor is brought into contact with the shield conductor.

By contrast, according to the first embodiment, the interlayer-connection conductors 31, 32 provided in the substrate 29 are electrically connected to the shield conductor 60. With this, the diameters of the vias in the substrate 29 and filled with the interlayer-connection conductors, 31, 32 determine the area by which the interlayer-connection conductors 31, 32 come into contact with the shield conductor 60. It is easier to increase the diameter of a via, than to increase the thickness of the internal electrode 40. It is therefore easier to increase the area by which the interlayer-connection conductors 31, 32 come into contact with the shield conductor 60, than to increase the area by which the internal electrodes 40 come into contact with the shield conductor 60. Therefore, the reliability of the connection between the interlayer-connection conductors 31, 32 and the shield conductor 60 can be improved.

According to the first embodiment, a larger number of the interlayer-connection conductors 30 can be electrically connected to the shield conductor 60. By electrically connecting a larger number of interlayer-connection conductors 30 to the shield conductor 60, it is possible to suppress unnecessary resonance in the LC resonator 91.

According to the first embodiment, the electronic component 10 includes the LC resonator 91. In addition, the shield conductor 60 is provided at least on the principal surface 20B of the substrate body 20, but is not provided on the principal surface 20A and the side surface 20C of the substrate body 20. As a result, less magnetic flux from the LC resonator 91 is shielded by the shield conductor 60.

If the shield conductor 60 is provided on the side surface 20C of the substrate body 20 as well as the principal surface 20B of the substrate body 20, the magnetic flux of the LC resonator 91 is shielded by the shield conductor 60 disposed on the side surface 20C of the substrate body 20. Therefore, the position where the LC resonator 91 can be disposed would be limited to a position offset from the side surface 20C of the substrate body 20, e.g., at the center portion of the substrate body 20, in a view from the thickness direction 100. According to the first embodiment, because the shield conductor 60 is not provided on the side surface 20C of the substrate body 20, it is possible to position the LC resonator 91 near the side surface 20C of the substrate body 20. That is, there is no limitation on the position where the LC resonator 91 is provided, such as that described above.

According to the first embodiment, the thickness T1 of the protective layer 70 is greater than the thickness T2 of the shield conductor 60 disposed on the principal surface 20B. Therefore, the protective layer 70, which has the thickness T1, is enabled to press the shield conductor 60 deeper into the substrate body 20. As a result, adhesiveness of the shield conductor 60 to the substrate body 20 can be enhanced.

Method for Manufacturing Electronic Component According to First Embodiment

Figure 4:
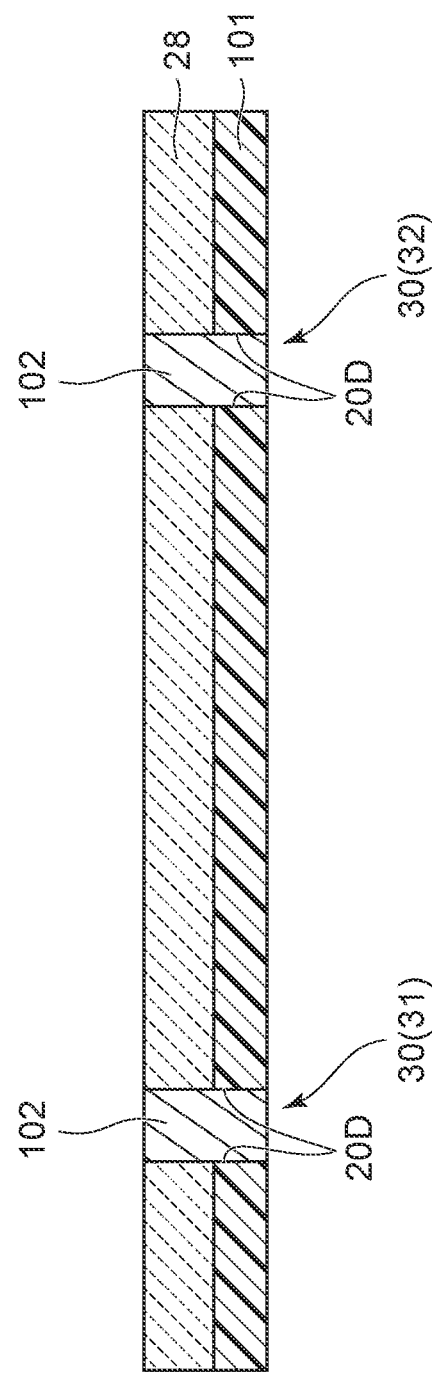
FIG. 4 is a cross-sectional view of a substrate resultant of forming interlayer-connection conductors in a process of manufacturing the electronic component according to the embodiment of the present disclosure.
Figure 5:
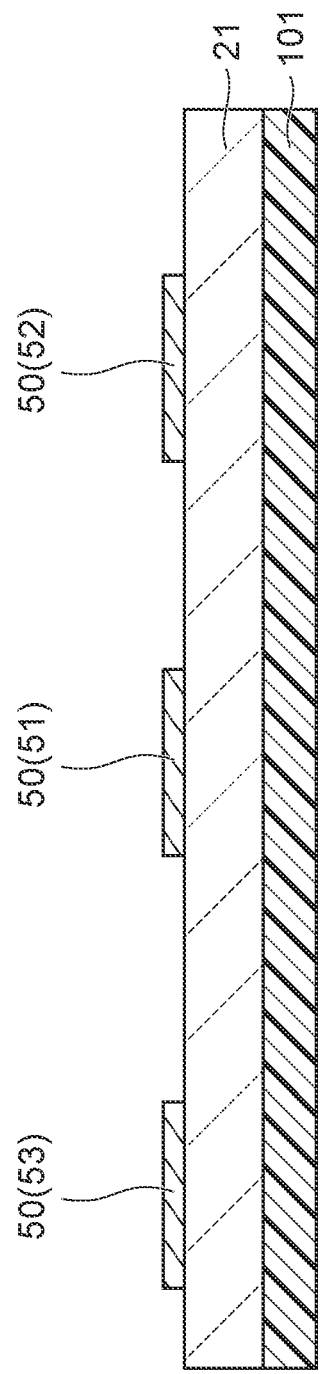
FIG. 5 is a cross-sectional view of the substrate resultant of printing of external electrodes, in the process of manufacturing the electronic component according to the embodiment of the present disclosure.
Figure 6:
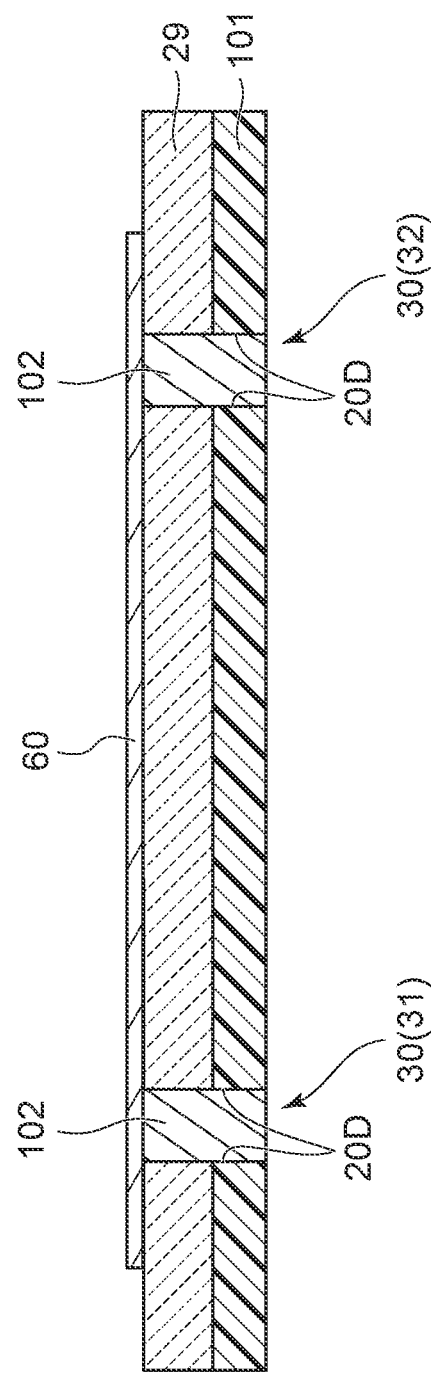
FIG. 6 is a cross-sectional view of the substrate resultant of printing a shield conductor in the process of manufacturing the electronic component according to the embodiment of the present disclosure.
Figure 7:
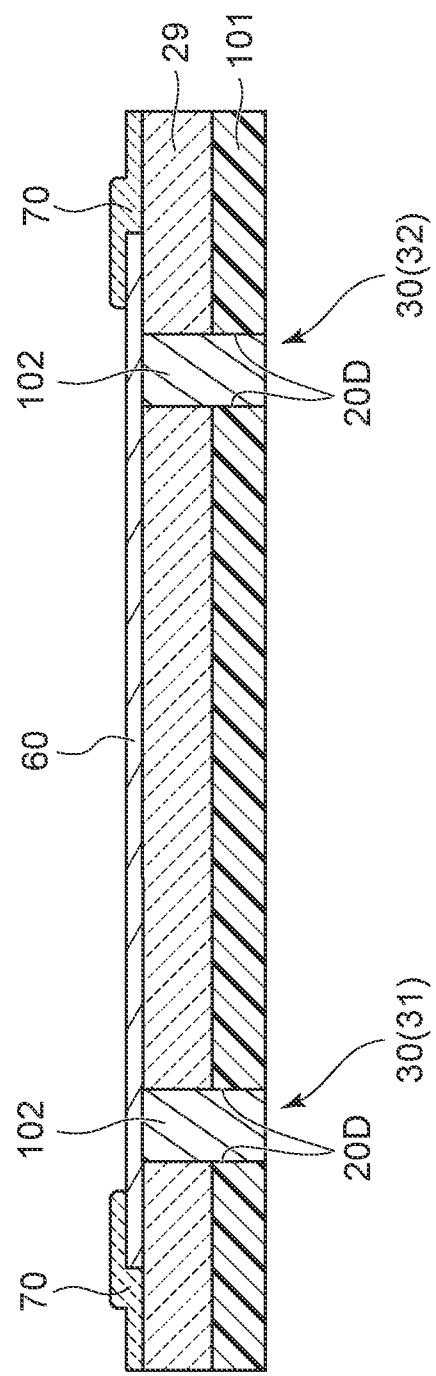
FIG. 7 is a cross-sectional view of the substrate and the shield conductor resultant of printing the protective layer, in the process of manufacturing the electronic component according to the embodiment of the present disclosure.
Figure 8:
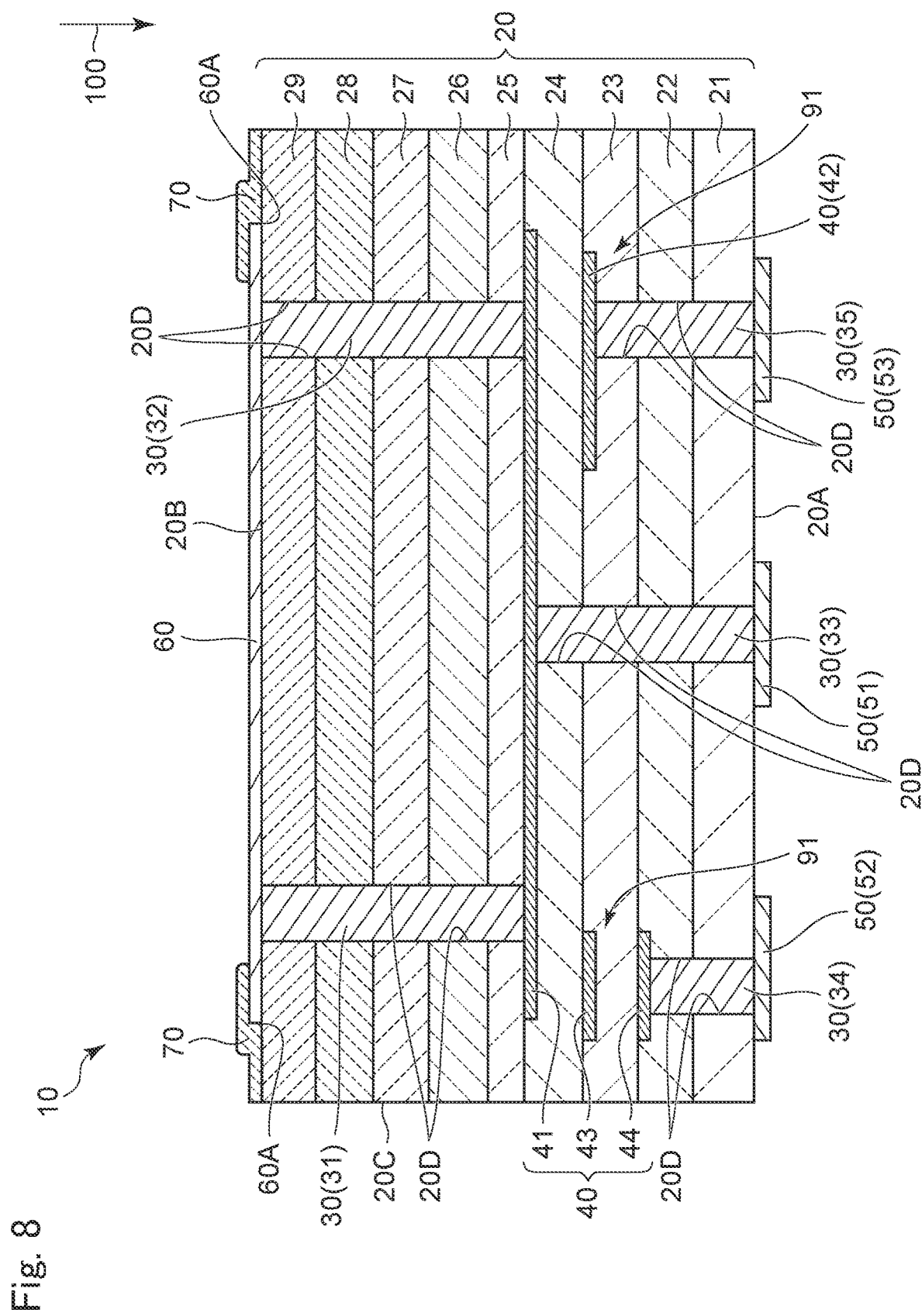
FIG. 8 is a cross-sectional view of a substrate body formed by laminating a plurality of substrates, in the process of manufacturing the electronic component according to the embodiment of the present disclosure.
Figure 9:
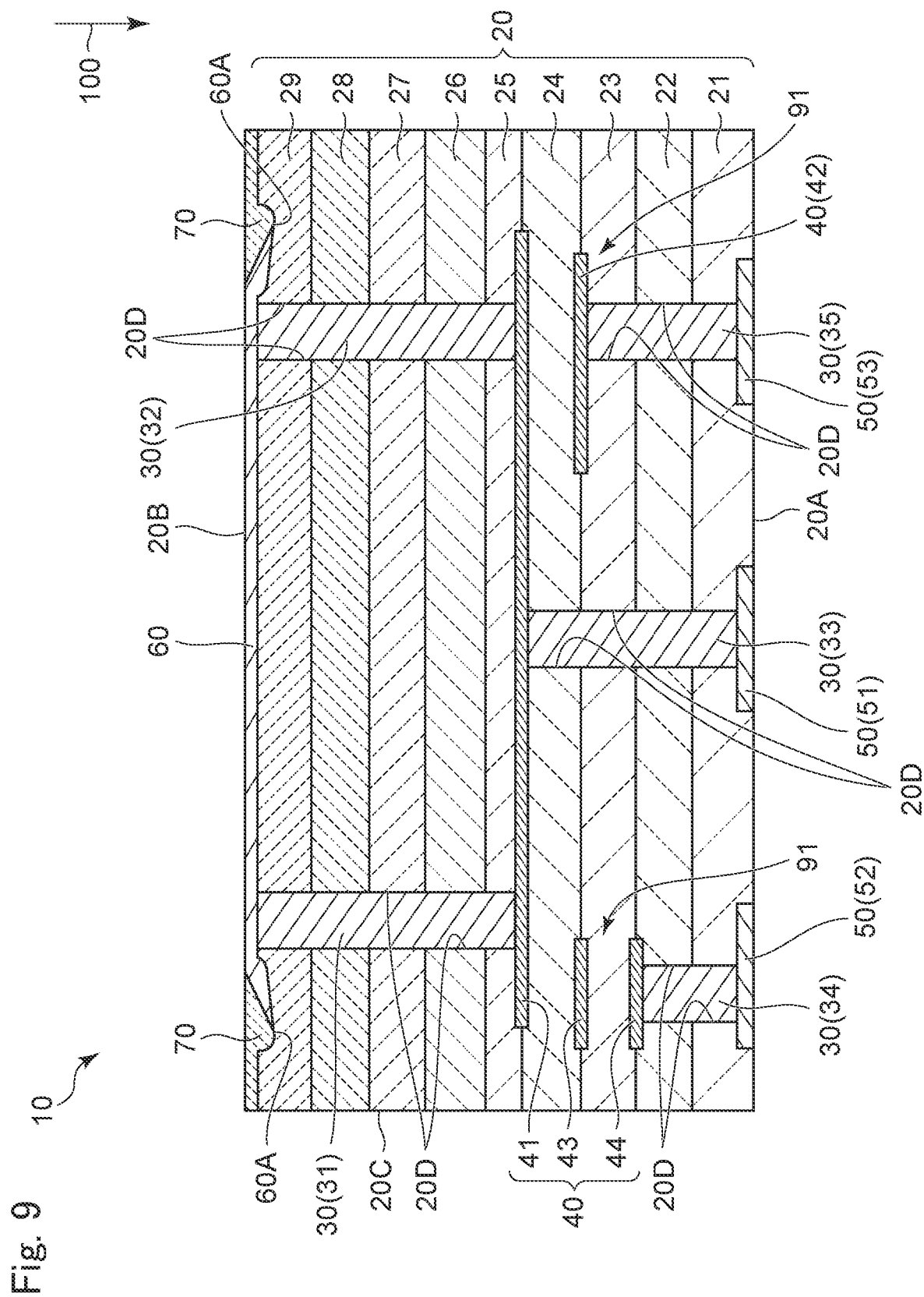
FIG. 9 is a cross-sectional view of the substrate body resultant of laminating, in the process of manufacturing the electronic component according to the embodiment of the present disclosure.

A method for manufacturing the electronic component 10 according to the first embodiment will be described below with reference to FIGS. 4 to 9. FIG. 4 is a cross-sectional view of a substrate resultant of forming interlayer-connection conductors in a process of manufacturing the electronic component according to the embodiment of the present disclosure. FIG. 5 is a cross-sectional view of the substrate resultant of printing of the external electrodes, in the process of manufacturing the electronic component according to the embodiment of the present disclosure. FIG. 6 is a cross-sectional view of the substrate resultant of printing a shield conductor in the process of manufacturing the electronic component according to the embodiment of the present disclosure. FIG. 7 is a cross-sectional view of the substrate and the shield conductor resultant of printing the protective layer, in the process of manufacturing the electronic component according to the embodiment of the present disclosure. FIG. 8 is a cross-sectional view of a substrate body formed by laminating a plurality of substrates, in the process of manufacturing the electronic component according to the embodiment of the present disclosure. FIG. 9 is a cross-sectional view of the substrate body resultant of laminating, in the process of manufacturing the electronic component according to the embodiment of the present disclosure.

The electronic component 10 is manufactured by singulating the laminate into a plurality of substrate bodies 20. The laminate is an integration of an arrangement of a plurality of substrate bodies 20. In FIGS. 4 to 9, for the convenience of description, only the portion corresponding to one substrate body 20 of the laminate is shown. The method for manufacturing the electronic component 10 according to the first embodiment includes a sheet formation step, an interlayer-connection conductor formation step, an electrode formation step, a shield conductor formation step, a protective layer formation step, a substrate body formation step, a lamination step, a singulation step, a firing step, and a plating layer formation step.

(Sheet Formation Step)

First, a sheet formation step is performed. In the sheet formation step, each of the substrates 21 to 29 shown in FIG. 2 is formed separately. For the substrates 21 to 29 formed in the sheet formation step, raw materials including a main agent, a plasticizer, a binder, and the like corresponding to each of the substrates 21 to 29 are mixed to prepare a slurry for forming the substrate 21 to 29. At this stage, each of the substrates 21 to 29 is a green sheet made from a slurry.

For each of the substrates 21 to 29, a sintering ceramic powder is used as a main agent, for example. As the plasticizer, phthalic acid ester or di-n-butyl phthalate is used, for example. As the binder, an acrylic resin or polyvinyl butyral is used, for example.

The slurry for forming each of the substrates 21 to 29 is formed into a sheet-like shape on a carrier film 101 shown in FIG. 4, using a lip coater or a doctor blade, for example. That is, the nine substrates 21 to 29 are formed on nine carrier films 101, respectively. As the carrier film 101, a polyethylene terephthalate (PET) film is used, for example. The thickness of each of the substrates 21 to 29 is set to 5 (μm) to 100 (μm), for example.

FIG. 4 shows the carrier film 101, and the substrate 28 formed on the carrier film 101.

Vias 20D penetrating the substrates 21 to 29 and the carrier film 101 in the thickness direction are then punched.

In FIG. 4, two vias 20D are punched on the substrate 28 and the carrier film 101, but the number of vias 20D punched on the substrates 21 to 29 is not limited to two. Furthermore, the number of vias 20D punched on the substrates 21 to 29 may be the same or different. Furthermore, the vias 20D in the substrates 21 to 29 may be punched at the same position or different positions.

In the method for manufacturing the electronic component 10 according to the first embodiment, the number and positions of the vias 20D punched in the nine substrates 21 to 29 and the carrier film 101 are determined so that the substrate body 20 shown in FIG. 2 is achieved.

(Interlayer-Connection Conductor Formation Step)

The interlayer-connection conductor formation step is performed next. In the interlayer-connection conductor formation step, the vias 20D, which have been punched in the substrates 21 to 29 and the carrier film 101 in the sheet formation step, are filled with conductive paste 102 (see FIG. 4). The paste 102 filled in the vias 20D corresponds to the interlayer-connection conductors 30.

The paste 102 is prepared by mixing raw materials including a conductive powder, a plasticizer, and a binder, for example.

(Electrode Formation Step)

The electrode formation step is performed next. In the electrode formation step, the internal electrodes 40 and the external electrodes 50 are formed.

In the method for manufacturing the electronic component 10 according to the first embodiment, for example, as shown in FIG. 5, paste corresponding to the external electrodes 50 (external electrodes 51, 52, 53) is applied on the principal surface of the substrate 21. The paste is applied by screen printing, inkjet printing, or gravure printing, for example. The internal electrodes 40 are formed on the substrate 21 to 29, in the same manner as the external electrodes 50.

The paste corresponding to the internal electrodes 40 and the external electrodes 50 is prepared by mainly mixing raw materials containing a conductive powder, a plasticizer, and a binder, in the same manner as the paste 102 described above. The paste corresponding to the internal electrodes 40 and the external electrodes 50 may be made of the same raw materials as those of the paste 102, or may be made of raw materials different from those of the paste 102.

(Shield Conductor Formation Step)

The shield conductor formation step is performed next. In the shield conductor formation step, the shield conductor 60 is formed.

In the method for manufacturing the electronic component 10 according to the first embodiment, as shown in FIG. 6, paste corresponding to the shield conductor 60 is applied on the principal surface of the substrate 29. The paste corresponding to the shield conductor 60 is applied by screen printing, inkjet printing, gravure printing, sputtering, vapor deposition, or a transfer method, for example. When the transfer method is used, the shield conductor is printed after the protective layer is printed, as will be described later.

The paste corresponding to the shield conductor is prepared by mainly mixing raw materials including a conductive powder, a plasticizer, and a binder, in the same manner as for the pastes described above (the paste corresponding to the internal electrode 40 and the paste 102 corresponding to the external electrodes 50). The paste corresponding to the shield conductor may be made of the same raw materials as those of the paste described above, or may be made of raw materials that are different from those of the paste described above.

The shield conductor formation step may be performed before the electrode formation step, or in parallel with the electrode formation step.

(Protective Layer Formation Step)

The protective layer formation step is performed next. In the protective layer formation step, the protective layer 70 is formed.

In the method for manufacturing the electronic component 10 according to the first embodiment, as shown in FIG. 7, the paste corresponding to the protective layer 70 is applied to the shield conductor 60, which has been formed on the principal surface of the substrate 29 in the shield conductor formation step. The paste corresponding to the protective layer 70 is applied by screen printing, inkjet printing, gravure printing, or a transfer method, for example. The paste corresponding to the protective layer 70 is made of the material for forming the protective layer 70, which are described above. In the method for manufacturing the electronic component 10 according to the first embodiment, the paste corresponding to the protective layer 70 is a LTCC paste. With the transfer method, the protective layer is printed on the outer peripheral portion of a transfer sheet, and then the shield conductor is printed on the central portion of the transfer sheet. At this time, the outer peripheral portion of the shield conductor is printed on top of the inner perimeter of the protective layer. In other words, the shield conductor and the protective layer partially overlap each other. The transfer sheet is then laid on the substrate 29 in such a manner that the shield conductor faces the substrate 29, in a substrate body formation step to be described below.

As described above, in the first embodiment, as shown in FIG. 2, the thickness T1 of the protective layer 70 is greater than the thickness T2 of the shield conductor 60 disposed on the principal surface 20B. In order to achieve this configuration, the paste corresponding to the protective layer 70 may be printed a plurality of number of times in an overlapping manner, in the protective layer formation step, for example. In this manner, the protective layer 70 is formed thicker than the shield conductor 60. The way in which the protective layer 70 is made thicker than the shield conductor 60 is not limited to printing the paste corresponding to the protective layer 70 a plurality of number of times. For example, in the protective layer formation step, the viscosity, specific gravity, or the like of the paste corresponding to the protective layer 70 may be adjusted so as to make the protective layer 70 thicker than the shield conductor 60.

(Substrate Body Formation Step)

The substrate body formation step is performed next. In the substrate body formation step, as shown in FIG. 8, the substrates 21 to 29, excluding the carrier film 101, are stacked. As a result, the substrate body 20 is formed.

In the substrate body formation step, the nine substrates 21 to 29 are stacked in the order from those with smaller reference numerals to those with larger reference numerals, specifically, in the order of substrates 21, 22, 23, 24, 25, 26, 27, 28, and 29. As a result, a principal surface of the substrate 21 becomes the principal surface 20A of the substrate body 20, and a principal surface of the substrate 29 becomes the principal surface 20B of the substrate body 20. The side surfaces of the substrate 21 to 29 together form the side surface 20C of the substrate body 20.

In the first embodiment, some of the nine substrates 21 to 29 are turned upside down, and stacked on substrates other than the some of the nine substrates 21 to 29. In the example shown in FIG. 8, the substrates 21 to 25 are stacked with their surface on the side of the carrier film 101 facing upwards in the drawing, and the substrates 26 to 29 are stacked with their surface on the side of the carrier film 101 facing downwards, in the drawing. With this, as shown in FIG. 8, the internal electrodes 40 formed on the substrates 23 to 25 and the external electrodes 50 formed on the substrate 21 come to be positioned under the substrates 23 to 25, and 21, respectively, and the shield conductor 60 formed on the substrate 29 comes to be positioned on top of the substrate 29. It is also possible for the nine substrates 21 to 29 to be stacked without turning upside down. For example, when the transfer method is used for printing the shield conductor and the protective layer, the nine substrates 21 to 29 are stacked without turning upside down.

(Lamination Step)

The lamination step is performed next. In the lamination step, the stacked substrates 21 to 29 are laminated in a die.

As shown in FIG. 9, in the process of laminating the substrates 21 to 29, the internal electrodes 40 are pressed into the substrates 23 to 25, the external electrodes 50 are pressed into the substrate 21, and the shield conductor 60 and the protective layer 70 are pressed into the substrate 29. This protective layer 70 then presses the outer peripheral portion of the shield conductor 60, in a view from the thickness direction 100, into the substrate 29. The outer peripheral portion of the shield conductor 60 is thus pressed deeper into the substrate 29 than the part other than the outer peripheral portion of the shield conductor 60, and becomes covered by the protective layer 70. As a result, the outer peripheral portion of the shield conductor 60 becomes nipped between the substrate body 20 and the protective layer 70, in the internal of the substrate body 20.

(Singulation Step)

The singulation step is performed next. In the singulation step, the laminate including an arrangement of the plurality of substrate bodies 20 is cut into the plurality of substrate bodies 20. To cut the laminate, a dicing saw, a guillotine cutter, a laser, or the like is used, for example. After the laminate is cut, the corners and the edges of the substrate bodies 20 may be polished by performing barrel processing or the like (see FIG. 2), for example. This polishing may also be performed after the firing step.

(Firing Step)

The firing step is performed next. In the firing step, the substrates 21 to 29 are fired, to form the substrate body 20 as a sintered body (see FIG. 2).

(Plating Layer Formation Step)

The plating layer formation step is performed next. In the plating layer formation step, the external electrodes 50 and the shield conductor 60 are subjected to known plating. As a result, as shown in FIG. 2, the plating layer 80 is formed in a manner covering the external electrodes 50 and the shield conductor 60.

Modification of First Embodiment

Figure 10:
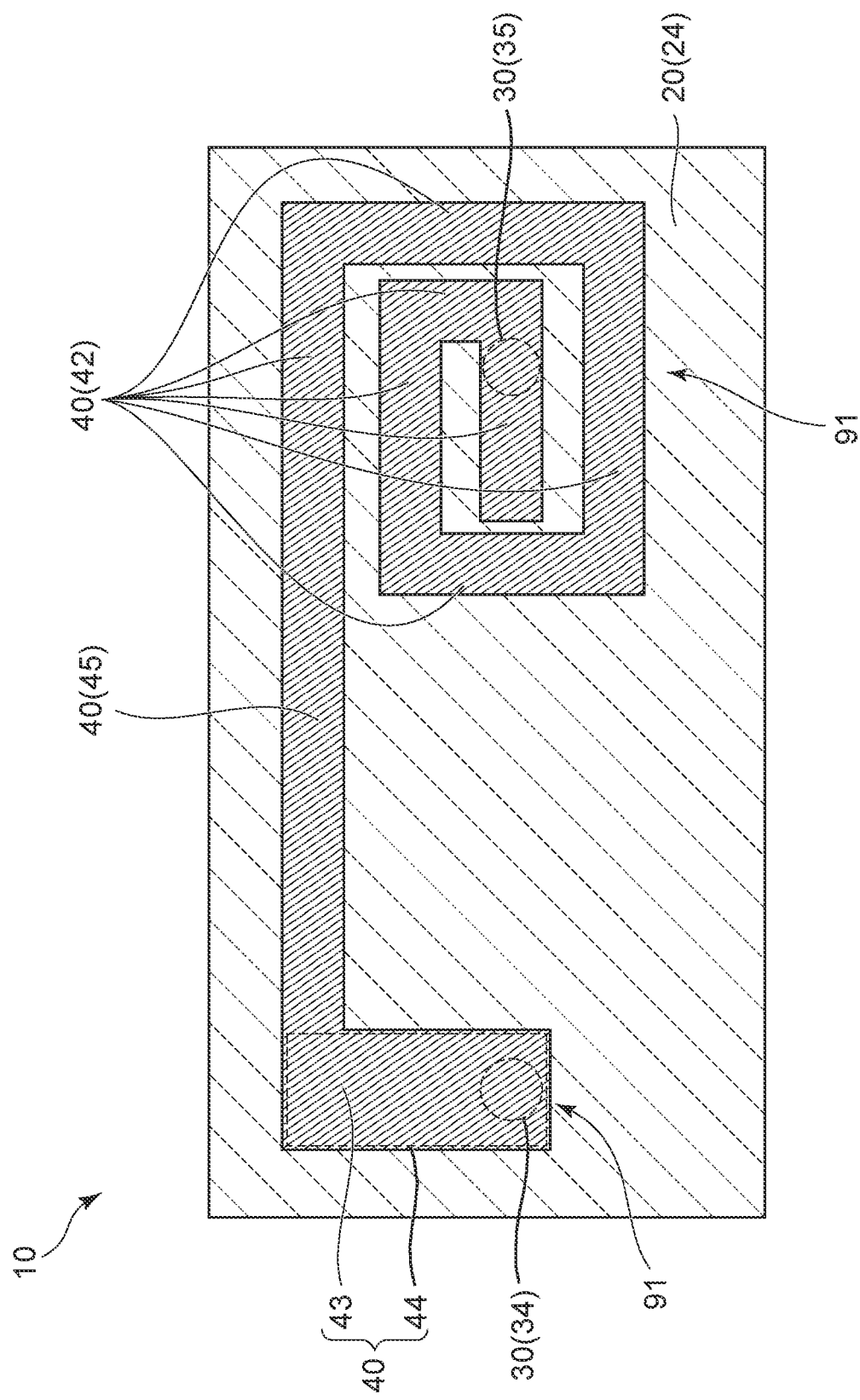
FIG. 10 is a cross-sectional view of an electronic component according to a modification of the first embodiment of the present disclosure, taken along a position corresponding to the cross section B-B in FIG. 2.

In the embodiment described above, the internal electrode 42 serving as an inductor forms a meander coil. However, the inductor included in the LC resonator 91 is not limited to a meander coil. For example, as shown in FIG. 10, the internal electrode 42 may be a spiral coil, in a plan view. FIG. 10 is a cross-sectional view of the electronic component according to the modification of the first embodiment of the present disclosure, taken along a position corresponding to the cross section B-B in FIG. 2.

Figure 11:
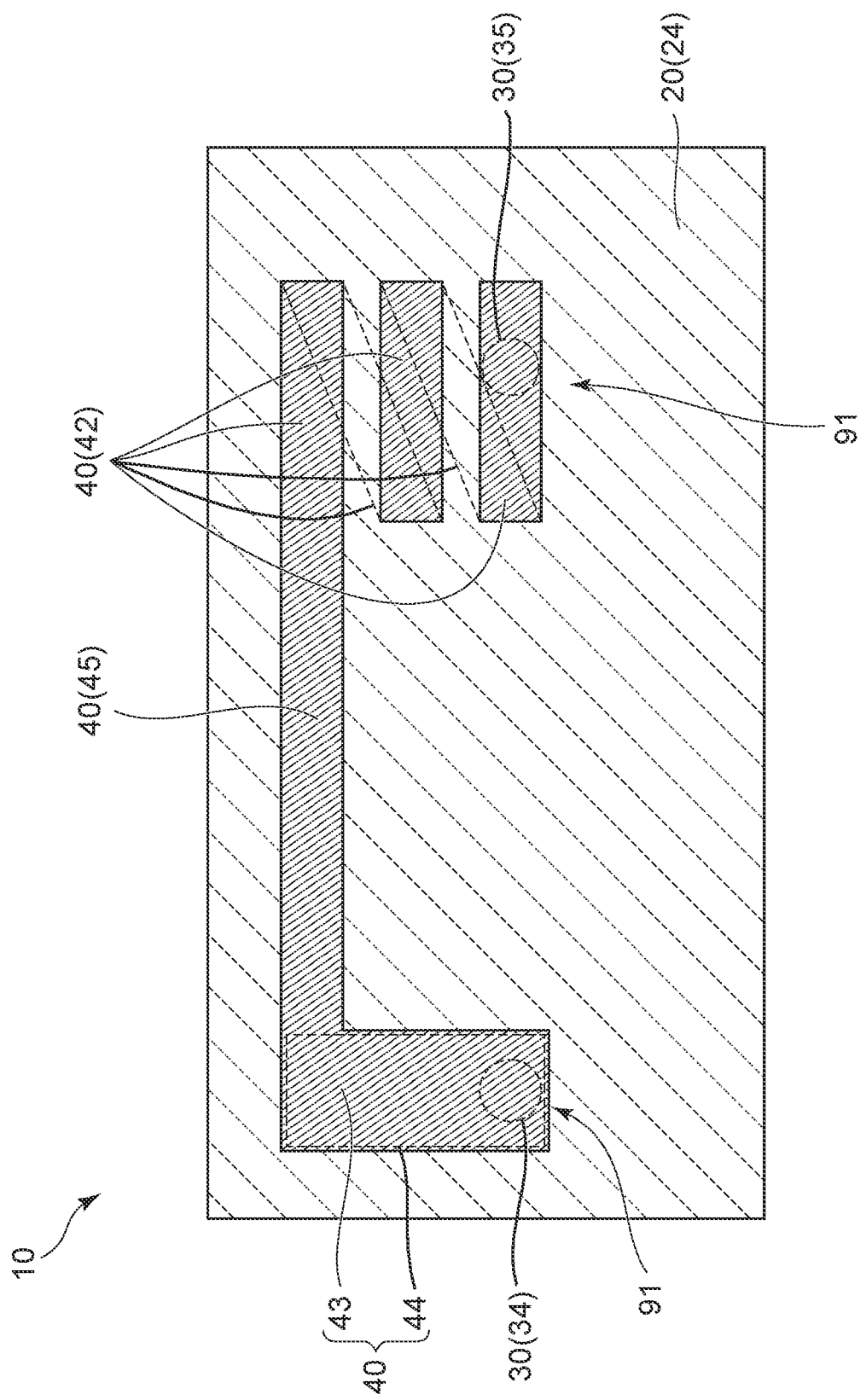
FIG. 11 is a cross-sectional view of the electronic component according to another modification of the first embodiment of the present disclosure, taken along a position corresponding to the cross section B-B in FIG. 2.

Furthermore, for example, as shown in FIG. 11, the internal electrode 42 may be a spiral coil in a side view. FIG. 11 is a cross-sectional view of the electronic component according to another modification of the first embodiment of the present disclosure, taken along a position corresponding to the cross section B-B in FIG. 2. Note that the internal electrodes 42 indicated by broken lines in FIG. 11 are formed on a substrate different from the substrate 23 (e.g., on the substrate 24). In FIG. 11, the internal electrodes 42 indicated by solid lines and the internal electrodes 42 indicated by broken lines are electrically connected by interlayer-connection conductors (not shown). In this manner, the internal electrode 42 shown in FIG. 11 delineates a spiral coil.

In the embodiment described above, the axis about which the coil of the internal electrode 42 is wound extends in the thickness direction 100. However, the axis of the winding of the coil may extend in a direction other than the thickness direction 100. For example, in the electronic component 10 shown in FIG. 11, the axis of the winding of the coil forming the internal electrode 42 extends along a direction following the principal surface of the substrate 24 (in other words, a direction perpendicular to the thickness direction 100).

In the embodiment described above, as shown in FIG. 2, the shield conductor 60 is provided on the principal surface 20B of the substrate body 20, but is not provided on the principal surface 20A and the side surface 20C of the substrate body 20. However, the shield conductor 60 may be provided on at least one of the principal surface 20A and the side surface 20C of the substrate body 20, in addition to the principal surface 20B of the substrate body 20. In other words, it is only necessary for the shield conductor 60 to be provided at least to the principal surface 20B of the outer surface of the substrate body 20.

Figure 12:
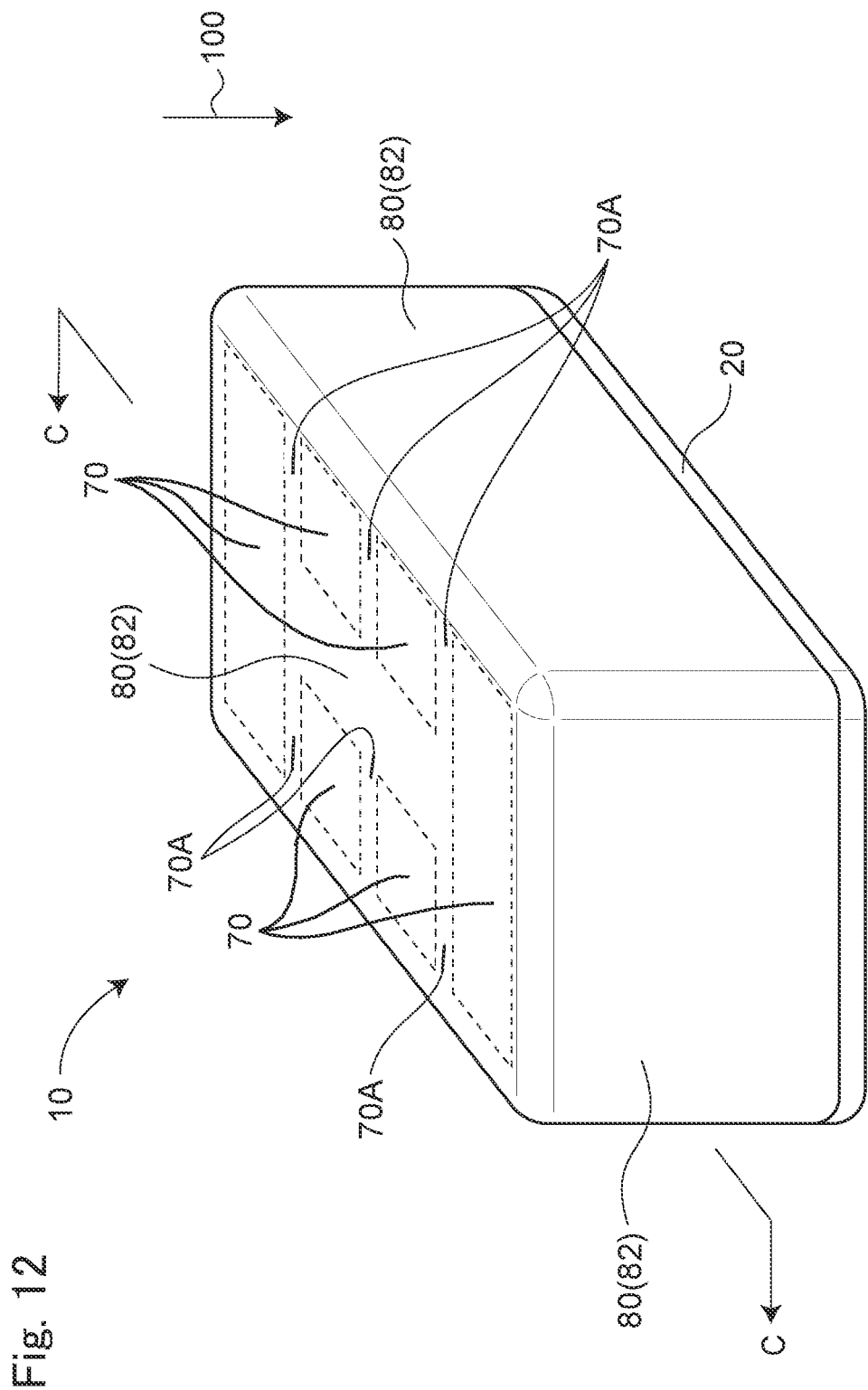
FIG. 12 is a perspective view of an electronic component according to another modification of the first embodiment of the present disclosure.
Figure 13:
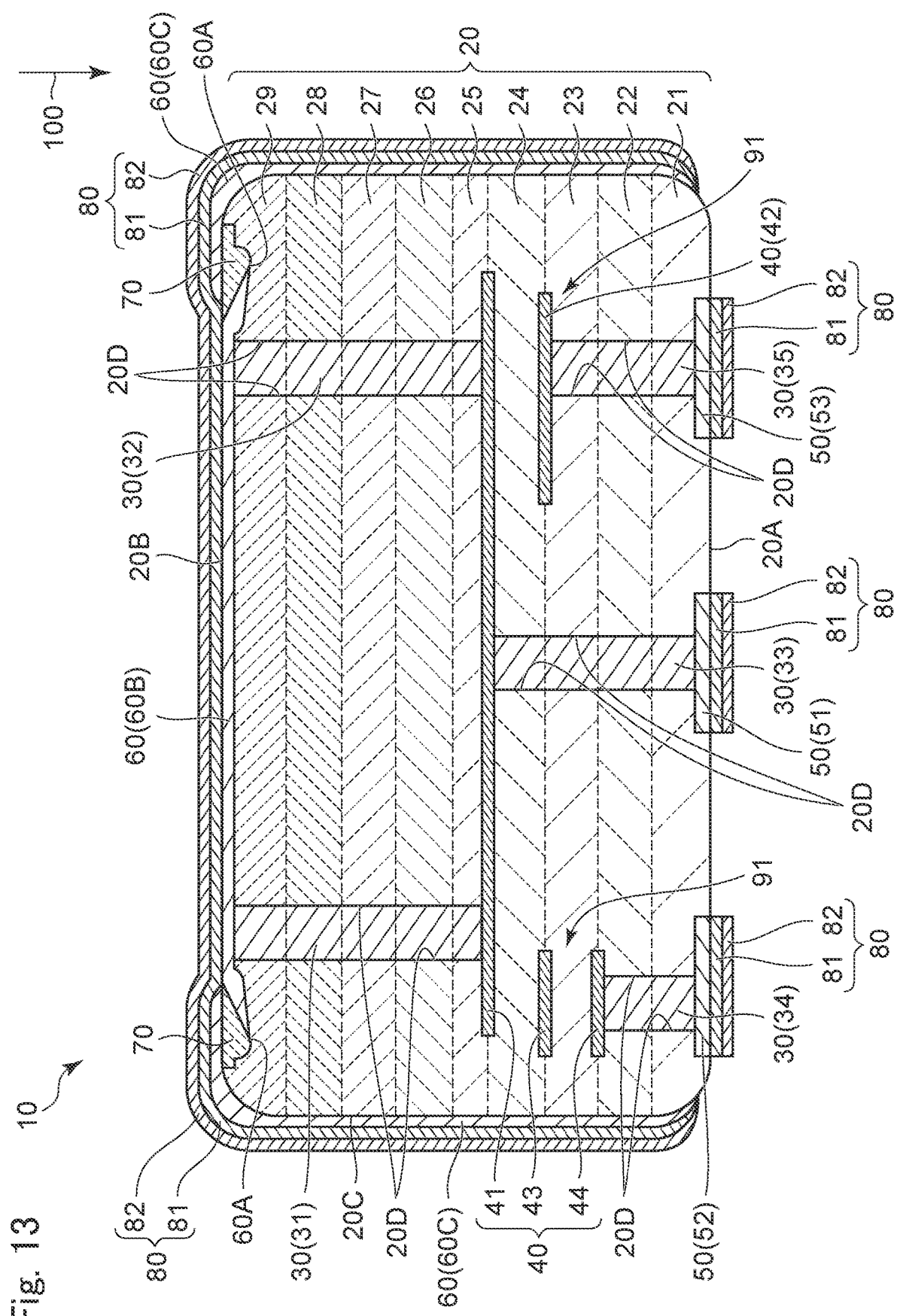
FIG. 13 is a cross-sectional view showing the cross section C-C in FIG. 12.

For example, the shield conductor 60 may include a principal-surface conductor 60B formed on the principal surface 20B of the substrate body 20 and side-surface conductors 60C formed on the side surfaces 20C of the substrate body 20, as shown in FIG. 13. In this configuration, because the shield conductor 60, which is covered by the plating layer 80, is also provided on the principal surface 20B and the side surfaces 20C of the substrate body 20, the principal surface 20B and the side surfaces 20C of the substrate body 20 are also covered by the plating layer 80, as shown in FIG. 12. FIG. 12 is a perspective view of an electronic component according to another modification of the first embodiment of the present disclosure. FIG. 13 is a cross-sectional view showing the cross section C-C in FIG. 12.

The side-surface conductors 60C are formed by a known technique, such as a dipping, after the singulation step but before the firing step. In the shield conductor formation step, the principal-surface conductor 60B is formed. The side-surface conductors 60C are formed on the side surfaces 20C of the substrate body 20 and the outer peripheral portion of the principal surface 20B of the substrate body 20 using a known technique such as dipping (see FIG. 13). The side-surface conductors 60C formed on the outer peripheral portion of the principal surface 20B of the substrate body 20 are electrically connected to the principal-surface conductor 60B. In FIG. 13, because the protective layer 70 is interposed between each of the side-surface conductors 60C and the principal-surface conductor 60B, the side-surface conductors 60C and the principal-surface conductor 60B are not connected. However, the side-surface conductor 60C and the principal-surface conductor 60B are electrically connected via a portion 70A where the protective layer 70 is not provided (see FIG. 12).

For the electronic component 10 shown in FIG. 13, in the plating layer formation step, the external electrodes 50, the principal-surface conductor 60B, and the side-surface conductors 60C are subjected to known plating. As a result, the plating layer 80 is laid in a manner covering the external electrodes 50, the principal-surface conductor 60B, and the side-surface conductors 60C, as shown in FIGS. 12 and 13.

In the embodiment described above, as shown in FIG. 2, two interlayer-connection conductors 31, 32 are formed on the substrate 25 to 29, including the substrate 29 on which the shield conductor 60 is formed, and the shield conductor 60 is electrically connected to the ground via the two interlayer-connection conductors 31, 32. However, the number of the interlayer-connection conductors 30 formed on the substrates including the substrate 29 on which the shield conductor 60 is formed, and electrically connecting the shield conductor 60 and the ground is not limited to two.

For example, one interlayer-connection conductor 30 may be provided on the substrate 29 on which the shield conductor 60 is formed, and the shield conductor 60 may be electrically connected to the ground via the one interlayer-connection conductor 30.

Figure 14:
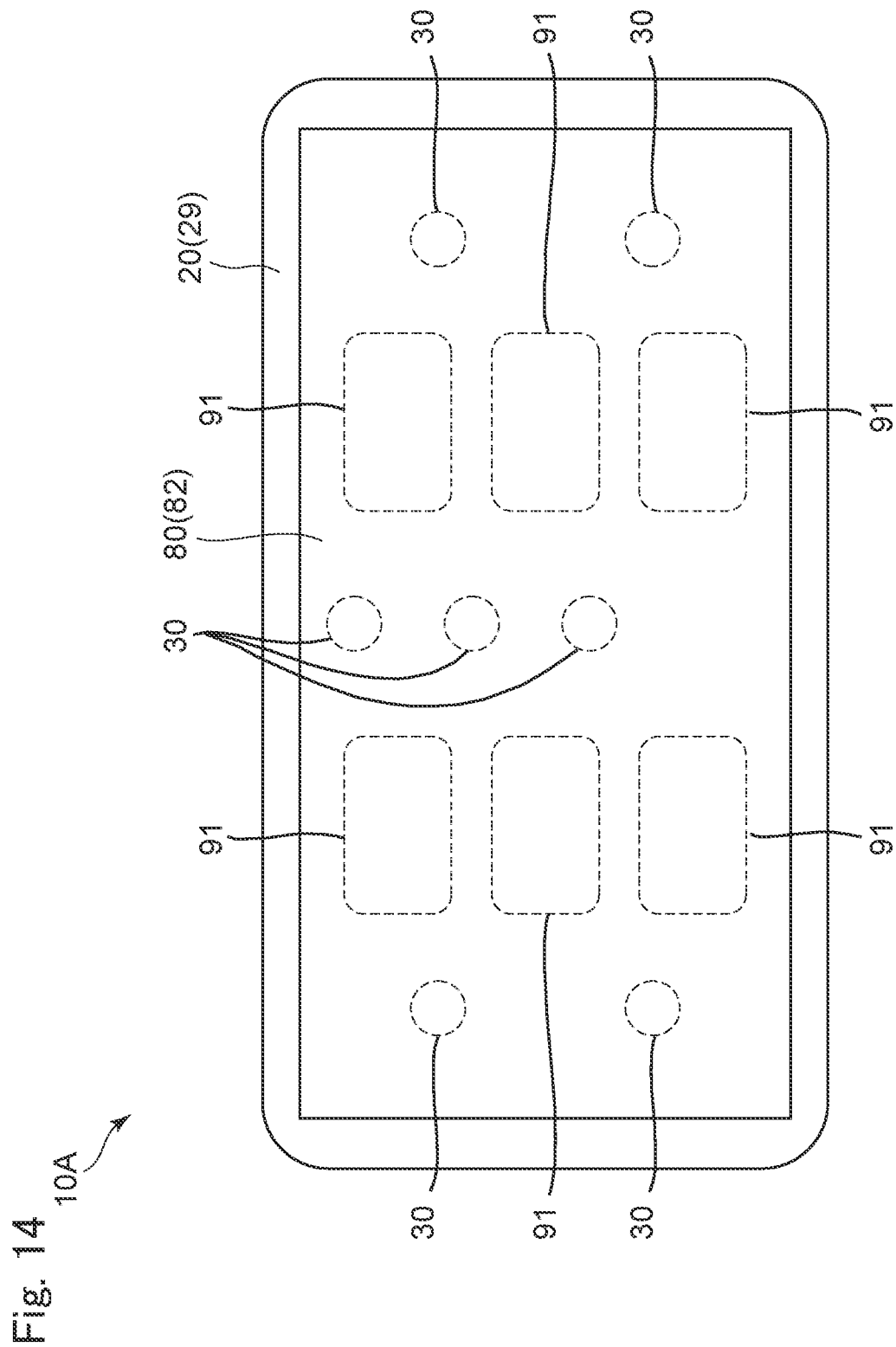
FIG. 14 is a plan view of an electronic component according to the modification of the first embodiment of the present disclosure.

Furthermore, as another example, three or more interlayer-connection conductors 30 may be provided in the substrate 29 on which the shield conductor 60 is formed, and the shield conductor 60 may be electrically connected to the ground via the three or more interlayer-connection conductors 30, as shown in FIG. 14. FIG. 14 is a plan view of an electronic component according to another modification of the first embodiment of the present disclosure.

This electronic component 10A shown in FIG. 14 includes six LC resonators 91. In addition, seven interlayer-connection conductors 30 are provided in the substrate 29 of the electronic component 10A, as indicated by the broken lines in FIG. 14. The shield conductor 60 is electrically connected to the seven interlayer-connection conductors 30. The seven interlayer-connection conductors 30 are electrically connected to the external electrode 51 that is electrically connected to the ground via at least one of the internal electrode 40 and another interlayer-connection conductors 30. That is, in the electronic component 10A shown in FIG. 14, the shield conductor 60 is electrically connected to the ground via the seven interlayer-connection conductors 30.

Second Embodiment

Figure 15:
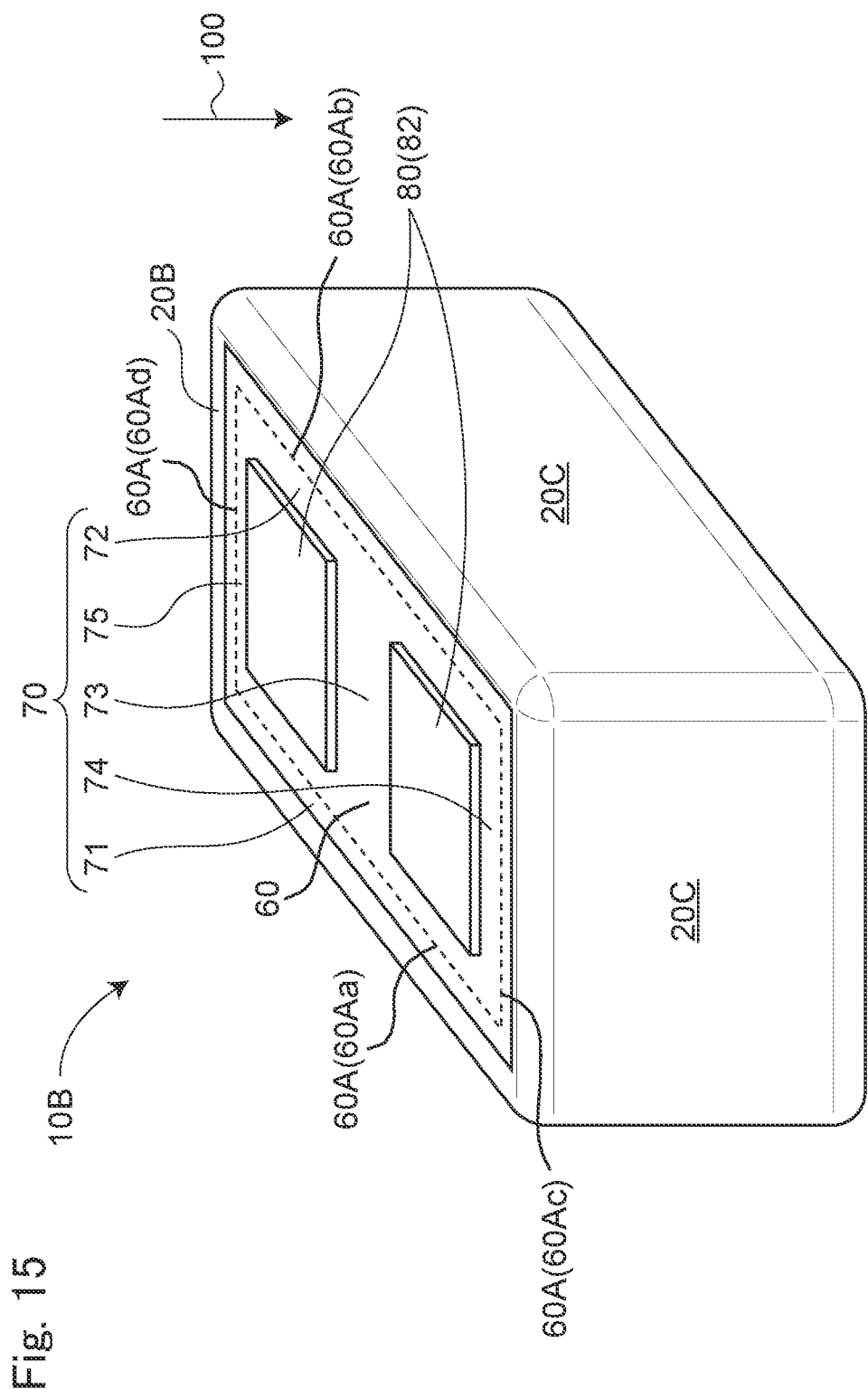
FIG. 15 is a perspective view of an electronic component according to a second embodiment of the present disclosure.

FIG. 15 is a perspective view of an electronic component according to a second embodiment of the present disclosure. This electronic component 10B according to the second embodiment is different from the electronic component 10 according to the first embodiment in that the protective layer 70 is formed not only in the neighboring portion neighboring the interface 60A, but also in a part other than the neighboring portion. Hereinafter, the difference with respect to the first embodiment will be described. The parts that are the same as those in the electronic component 10 according to the first embodiment are denoted by the same reference numerals, and the description thereof will be basically omitted, and described as necessary.

As shown in FIG. 15, the interface 60A includes four parts. These four parts are interfaces 60Aa, 60Ab, 60Ac, and 60Ad. The interfaces 60Aa and 60Ab face each other in the direction along the principal surface 20B, with the plating layer 80 therebetween. The interfaces 60Ac and 60Ad face each other in the direction along the principal surface 20B, with the plating layer 80 therebetween. This plating layer 80 covers the shield conductor 60. In other words, the interfaces 60Aa and 60Ab face each other with the shield conductor 60 therebetween, and the interfaces 60Ac and 60Ad face each other with the shield conductor 60 therebetween. The interface 60Aa is an example of a first interface. The interface 60Ab is an example of a second interface. The interface 60Ac connects one end of the interface 60Aa and one end of the interface 60Ab. The interface 60Ad connects the other end of the interface 60Aa and the other end of the interface 60Ab.

The protective layer 70 includes a first portion 71, a second portion 72, a third portion 73, a fourth portion 74, and a fifth portion 75.

The first portion 71 straddles the interface 60Aa. The second portion 72 straddles the interface 60Ab. The fourth portion 74 straddles the interface 60Ac. The fifth portion 75 straddles the interface 60Ad. The first portion 71 and the second portion 72 face each other in the direction along the principal surface 20B. The fourth portion 74 and the fifth portion 75 face each other in the direction along the principal surface 20B. The fourth portion 74 connects one end of the first portion 71 and one end of the second portion 72. The fifth portion 75 connects the other end of the first portion 71 and the other end of the second portion 72.

The third portion 73 connects the first portion 71 and the second portion 72 in a manner traversing across the shield conductor 60 between the interfaces 60Aa and 60Ab, in a view from the thickness direction 100. The third portion 73 is formed on the shield conductor 60 in the protective layer formation step, in the same manner as the other portions of the protective layer 70.

According to the second embodiment, the third portion 73 of the protective layer 70 is formed in a manner traversing across the shield conductor 60. As a result, adhesiveness of the shield conductor 60 to the substrate body 20 can be enhanced.

Third Embodiment

Figure 16:
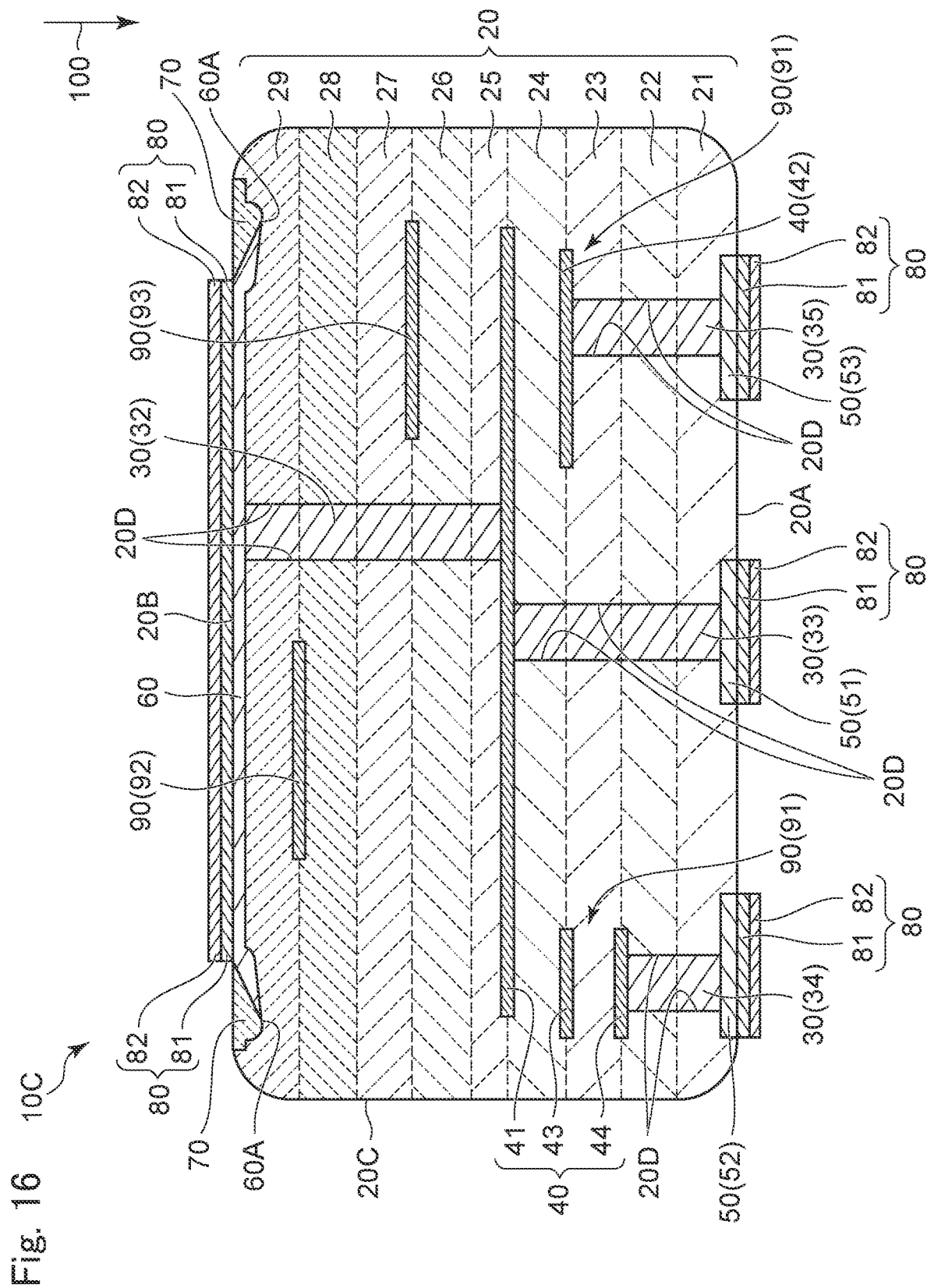
FIG. 16 is a cross-sectional view of the electronic component according to a third embodiment of the present disclosure, taken along a position corresponding to the cross section A-A in FIG. 1.

FIG. 16 is a cross-sectional view of the electronic component according to a third embodiment of the present disclosure, taken along a position corresponding to the cross section A-A in FIG. 1. This electronic component 10C according to the third embodiment is different from the electronic component 10 according to the first embodiment in that the protective layer 70 is provided at a position offset from an internal electrode 92 that is the element closest to the principal surface 20B in the thickness direction 100, among the elements of the internal circuit 90, in a view from the thickness direction 100. Hereinafter, the difference with respect to the first embodiment will be described. The parts that are the same as those in the electronic component 10 according to the first embodiment are denoted by the same reference numerals, and the description thereof will be basically omitted, and described as necessary.

As shown in FIG. 16, the electronic component 10C includes an internal circuit 90 in the substrate body 20. The internal circuit 90 includes, for example, elements such as a resistor, a terminal, or wiring, in addition to the inductor and the capacitor. The internal circuit 90 is a circuit including a combination of these elements. The internal circuit 90 is formed by interlayer-connection conductors 30, the internal electrodes 40, and the like. The internal circuit 90 are provided on at least one of the substrates 21 to 29. In the third embodiment, the internal circuit 90 includes the LC resonator 91, the internal electrodes 92, 93, and an interlayer-connection conductor (not shown) and an internal electrode (not shown) that electrically connect these elements.

The internal electrode 92 is provided on the substrate 28. The internal electrode 93 is provided on the substrate 26. The distance between the internal electrode 92 and the principal surface 20B, in the thickness direction 100, is shorter than the distance between the LC resonator 91 and the principal surface 20B in the thickness direction 100. The distance between the internal electrode 92 and the principal surface 20B in the thickness direction 100 is shorter than the distance between the internal electrode 93 and the principal surface 20B in the thickness direction 100. In other words, the internal electrode 92 is the element closest to the principal surface 20B in the thickness direction 100, among the elements included in the internal circuit 90.

The protective layer 70 and the internal electrode 92 do not overlap each other in a view from the thickness direction 100. In other words, the protective layer 70 is provided at a position offset from the internal electrode 92, in a view from the thickness direction 100.

Figure 17:
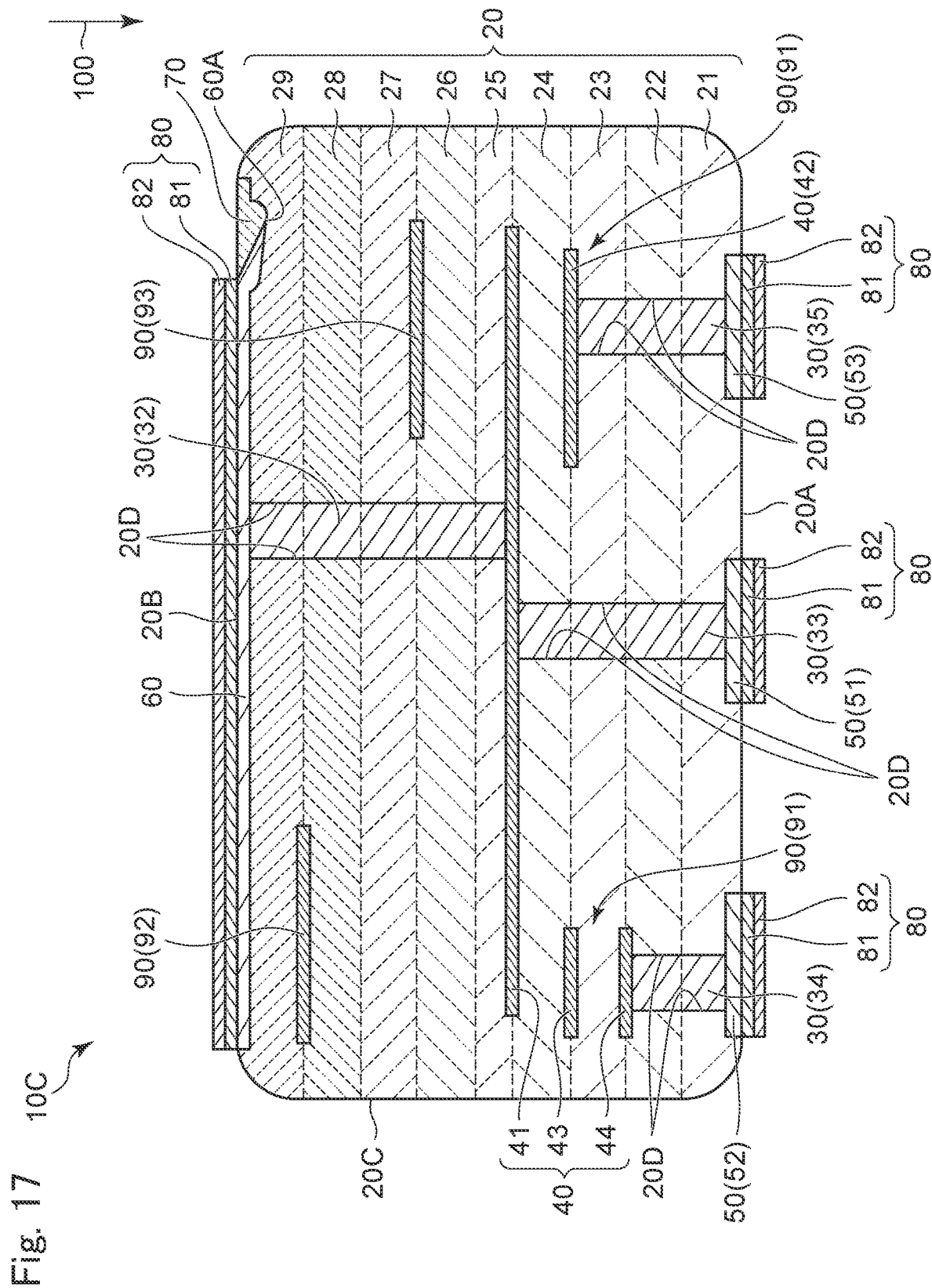
FIG. 17 is a cross-sectional view of the electronic component according to a modification of the third embodiment of the present disclosure, taken along a position corresponding to the cross section A-A in FIG. 1.

FIG. 17 is a cross-sectional view of the electronic component according to the modification of the third embodiment of the present disclosure, taken along a position corresponding to the cross section A-A in FIG. 1. A configuration in which the protective layer 70 and the internal electrode 92 do not overlap each other in a view from the thickness direction 100 is not limited to the configuration shown in FIG. 16. For example, as shown in FIG. 17, the configuration in which the protective layer 70 is formed at a position offset from the internal electrode 92 may be achieved by not forming the protective layer 70 at a position overlapping with the internal electrode 92 in a view from the thickness direction 100.

It is highly likely that the part of the shield conductor 60 covered by the protective layer 70 will be pressed by the protective layer 70, and dig into the substrate body 20. If the internal circuit 90 is formed near immediately below such a part of the shield conductor 60, such a part of the shield conductor 60 would come near the internal circuit 90 in the thickness direction 100, and a higher parasitic capacitance would be generated between the part of the shield conductor 60 and the internal circuit 90. According to the third embodiment, however, the protective layer 70 is formed at a position offset from the element (internal electrode 92) of the internal circuit 90 closest to the principal surface 20B in the thickness direction 100, in a view from the thickness direction 100. Therefore, it is possible to suppress the reduction in the distance between the shield conductor 60 and the internal electrode 92 in the thickness direction 100. As a result, it becomes possible to suppress generation of a high parasitic capacitance between the shield conductor 60 and the internal electrode 92.

Fourth Embodiment

Figure 18:
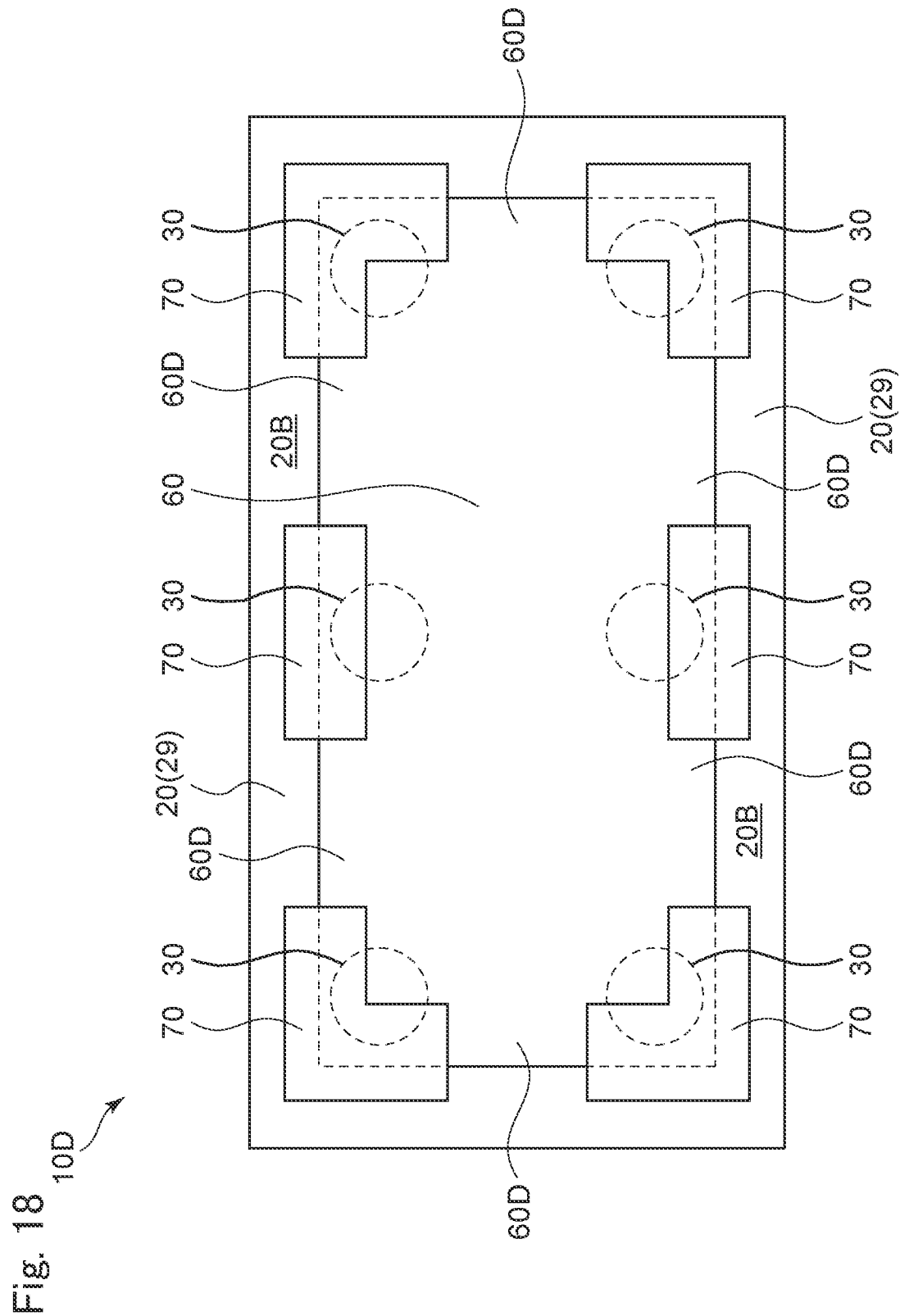
FIG. 18 is a plan view of an electronic component according to a fourth embodiment of the present disclosure.

FIG. 18 is a plan view of an electronic component according to a fourth embodiment of the present disclosure. This electronic component 10D according to the fourth embodiment is different from the electronic component 10 according to the first embodiment in that the protective layer 70 overlaps with the interlayer-connection conductor 30 provided on the substrate 29, in a view from the thickness direction 100. Hereinafter, the difference with respect to the first embodiment will be described. The parts that are the same as those in the electronic component 10 according to the first embodiment are denoted by the same reference numerals, and the description thereof will be basically omitted, and described as necessary.

In the fourth embodiment, six interlayer-connection conductors 30 are provided in the substrate 29 of the substrate body 20. The six interlayer-connection conductors 30 are electrically connected to the shield conductor 60 provided on the principal surface 20B of the substrate body 20. In FIG. 18, the six interlayer-connection conductors 30 are indicated by broken lines. As shown in FIG. 18, the six interlayer-connection conductors 30 are disposed in an outer peripheral portion 60D of the shield conductor 60, in a view from the thickness direction 100.

The outer peripheral portion 60D of the shield conductor 60 is a portion excluding the central portion of the shield conductor 60, in a view from the thickness direction 100. In other words, the outer peripheral portion 60D of the shield conductor 60 is a peripheral portion corresponding to the sides of a rectangle delineated by the shield conductor 60 having a rectangular shape, in a view from the thickness direction 100. The outer peripheral portion 60D of the shield conductor 60 is, for example, a portion nearer to the sides of the rectangle, than to the center of the rectangle.

Note that, in FIG. 18, all of the interlayer-connection conductors 30 provided on the substrate 29 are disposed in the outer peripheral portion 60D of the shield conductor 60, but it is also possible for only some of the interlayer-connection conductors 30 on the substrate 29 to be disposed in the outer peripheral portion 60D of the shield conductor 60.

In the fourth embodiment, the protective layer 70 straddles a part of the interface 60A of the shield conductor 60. The position where the protective layer 70 is provided is not limited to the position shown in FIG. 18. The protective layer 70 may also straddle the entire interface 60A of the shield conductor 60.

In a view from the thickness direction 100, the protective layer 70 overlaps with a part of each of the six interlayer-connection conductors 30 provided on the substrate 29. In a view from the thickness direction 100, the protective layer 70 straddles each one of the six interlayer-connection conductors 30 and the shield conductor 60.

Figure 19:
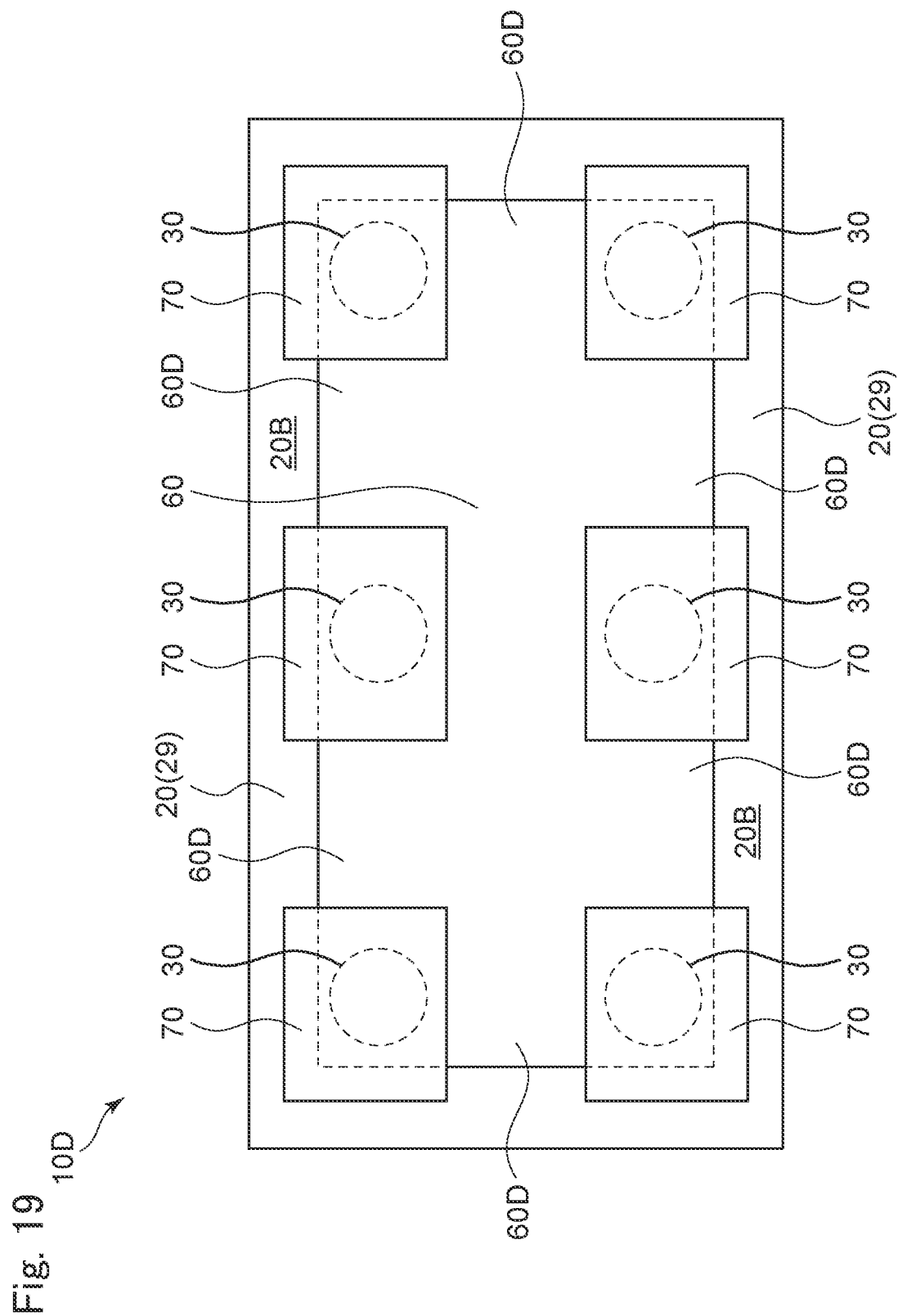
FIG. 19 is a plan view of an electronic component according to a modification of the fourth embodiment of the present disclosure.

FIG. 19 is a plan view of an electronic component according to a modification of the fourth embodiment of the present disclosure. In FIG. 18, the protective layer 70 overlaps with a part of the interlayer-connection conductors 30 provided on the substrate 29. That is, each of the interlayer-connection conductors 30 provided on the substrate 29 includes a part overlapping with the protective layer 70 and a part not overlapping with the protective layer 70, in a view from the thickness direction 100. However, as shown in FIG. 19, the protective layer 70 may be configured to overlap with the entire interlayer-connection conductors 30 provided on the substrate 29. That is to say, as shown in FIGS. 18 and 19, the protective layer 70 only needs to overlap with at least a part of the interlayer-connection conductor 30 provided on the substrate 29, in a view from the thickness direction 100.

With the configuration in which the interlayer-connection conductors 30 are provided in the outer peripheral portion 60D of the shield conductor 60, in a view from the thickness direction 100, during the process of firing the substrate body 20, the outer peripheral portion 60D of the shield conductor 60 may rise from the substrate body 20, because of the contraction of the substrate 21 to 29 or the outgas from the interlayer-connection conductors 30, for example. According to the fourth embodiment, however, the protective layer 70 is disposed immediately on top of the interlayer-connection conductors 30 covered by the outer peripheral portion 60D of the shield conductor 60, in a view from the thickness direction 100. In this manner, the protective layer 70 can suppress the rise of the outer peripheral portion 60D of the shield conductor 60 from the substrate body 20.

Fifth Embodiment

Figure 20:
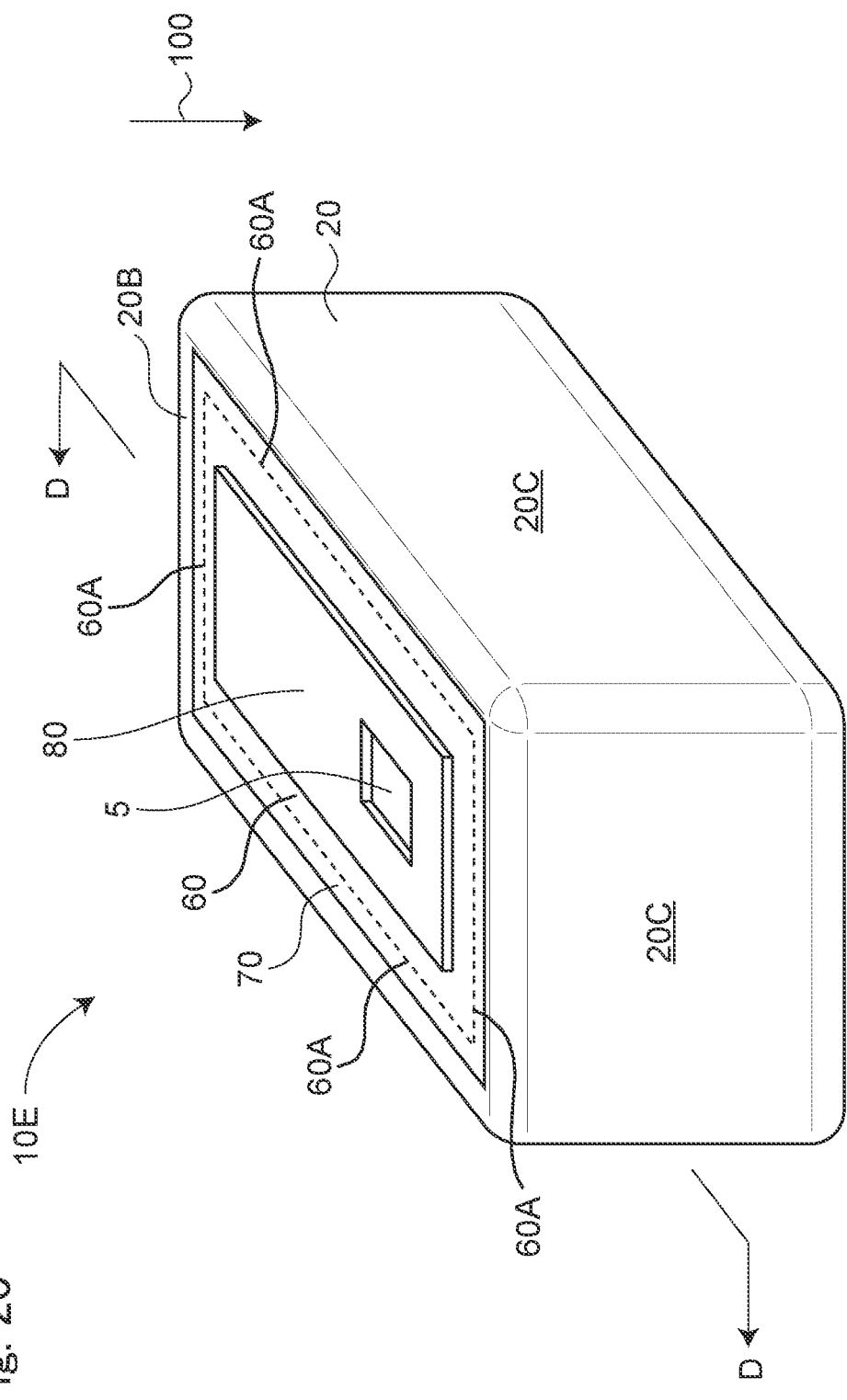
FIG. 20 is a perspective view of an electronic component according to a fifth embodiment of the present disclosure.

FIG. 20 is a perspective view of an electronic component according to a fifth embodiment of the present disclosure.

Figure 21:
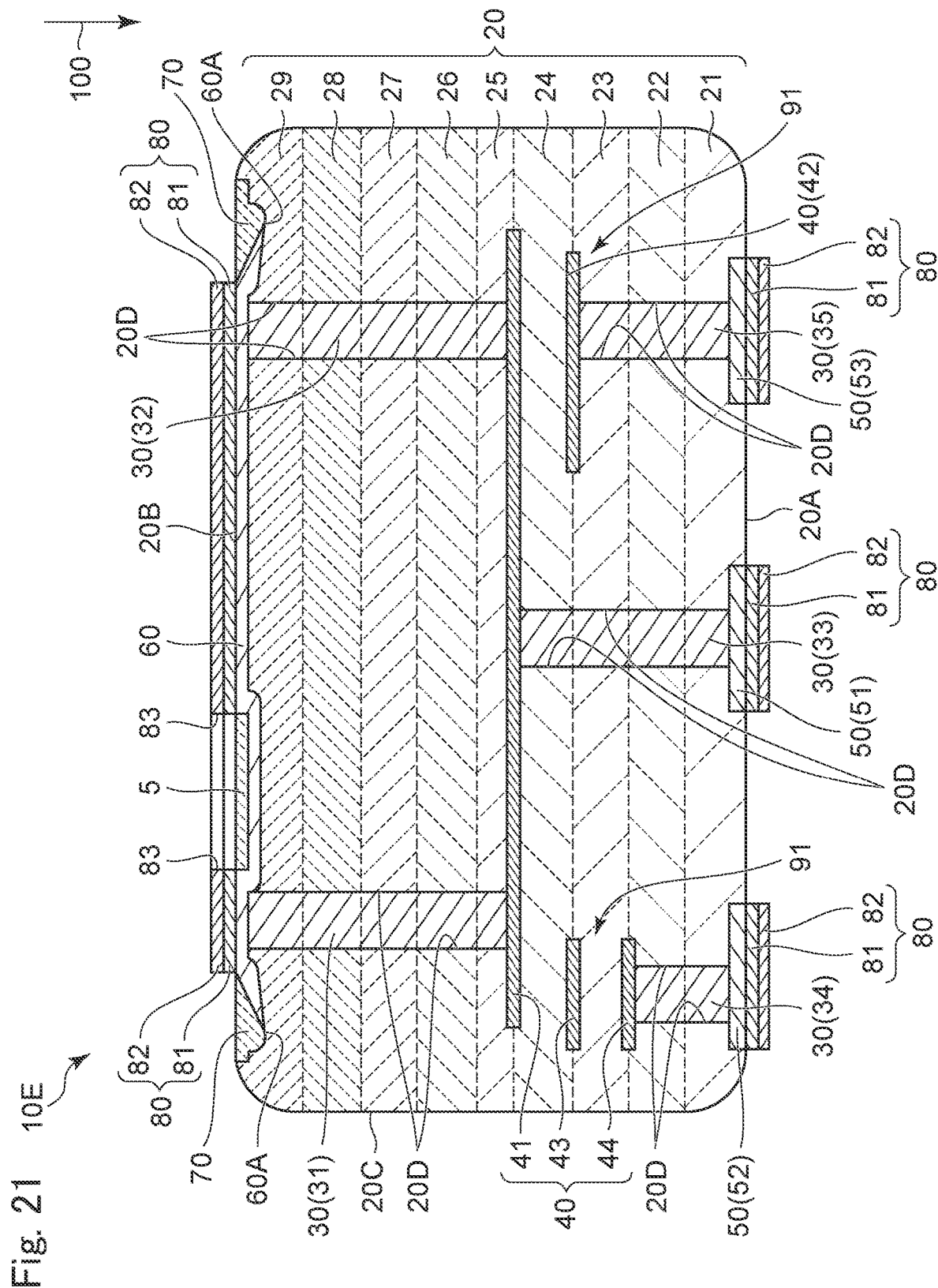
FIG. 21 is a cross-sectional view showing the cross section D-D in FIG. 20.

FIG. 21 is a cross-sectional view showing the cross section D-D in FIG. 20. This electronic component 10E according to the fifth embodiment is different from the electronic component 10 according to the first embodiment in that an identification mark 5 is provided on the surface of the shield conductor 60. Hereinafter, the difference with respect to the first embodiment will be described. The parts that are the same as those in the electronic component 10 according to the first embodiment are denoted by the same reference numerals, and the description thereof will be basically omitted, and described as necessary.

As shown in FIGS. 20 and 21, the identification mark 5 is provided on the surface of the shield conductor 60 provided on the principal surface 20B of the substrate body 20. The identification mark 5 is for indicating the orientation or the direction of the electronic component 10.

In the fifth embodiment, the electronic component 10 has one identification mark 5, but may include a plurality of identification marks 5. Furthermore, in the fifth embodiment, as shown in FIG. 20, the identification mark 5 has a square shape in a view from the thickness direction 100, but is not limited to a square shape. In FIG. 20, the color of the identification mark 5 is indicated as white, but the color of the identification mark 5 is not limited to white, and may be other colors such as black, gray, or red. The color of the identification mark 5 may be a color different from that of the area surrounding the identification mark 5 (the plating layer 80 in the fifth embodiment).

The identification mark 5 is made of a nonmetallic material. In this manner, it is possible to improve the distinguishability of the identification mark 5 with respect to the plating layer 80 made of a metal material. In the fifth embodiment, the identification mark 5 is made of the same material as those of the substrate body 20 and the protective layer 70.

Note that any material may be used as the material of the identification mark 5, provided that the material is distinguishable from that of the area surrounding the identification mark 5 (the plating layer 80 in the fifth embodiment). For example, the identification mark 5 may be made of resin. It is also possible to, when the identification mark 5 is made of a material having the same color as or a color similar to the color of the plating layer 80, improve the visibility of the identification mark 5 by coloring the identification mark 5 to a color different from that of the plating layer 80. It is also possible to use a material different from those of the substrate body 20 and the protective layer 70 for the identification mark 5.

In addition, a plurality of types of materials may be mixed for the identification mark 5. For example, the identification mark 5 may include an oxide of any of aluminum (Al), zinc (Zn), zirconium (Zr), titanium (Ti), cobalt (Co), magnesium (Mg), manganese (Mn), calcium (Ca), silicon (Si), iron (Fe), nickel (Ni), chromium (Cr), barium (Ba), or tungsten (W).

In the fifth embodiment, the identification mark 5 thrusts into the shield conductor 60, and is embedded in the substrate body 20 together with the shield conductor 60. Note that it is also possible for the identification mark 5 not to thrust into the shield conductor 60 and the substrate body 20.

As shown in FIG. 21, there is no interlayer-connection conductor 30 immediately below the identification mark 5. The identification mark 5 and the interlayer-connection conductors 30 do not overlap with each other in a view from the thickness direction 100. In other words, the identification mark 5 is provided at a position offset from the interlayer-connection conductor 30, in a view from the thickness direction 100.

The configuration of the plating layer 80 may be decided based on the contrast with the identification mark 5. For example, when the identification mark 5 is made of a ceramic paste containing zinc oxide (ZnO), the color of which is near black, gold is used for the outermost layer (for example, the outer layer 82) of the plating layer 80. In this manner, it is possible to ensure the contrast of the identification mark 5 with respect to the gold surrounding the identification mark 5. As another example, when the identification mark 5 is made of a white ceramic paste containing aluminum oxide ($Al_2O_3$), tin, which is gray, is used for the outermost layer (for example, the outer layer 82) of the plating layer 80. In this manner, it is possible to ensure the contrast of the white identification mark 5 with respect to the gray surrounding. In the manner described above, the visibility of the identification mark 5 can be improved.

In the fifth embodiment, the thickness (the length in the thickness direction 100) of the plating layer 80 is greater than the thickness of the identification mark 5. The identification mark 5 also rests on the bottom of a recess 83 formed by the plating layer 80. With this, it is possible to reduce the risk of the identification mark 5 coming into contact with another component or the like, when the electronic component 10E comes into contact with the other component or the like. As a result, it is possible to reduce the risk of damages of the identification mark 5.

In the fifth embodiment, because the plating layer 80 is thicker than the identification mark 5, the identification mark 5 rests on the bottom of the recess 83, even in a configuration in which the identification mark 5 is not embedded in the shield conductor 60.

An identification mark formation step of forming the identification mark 5 is performed after the shield conductor formation step but before the substrate body formation step. As mentioned earlier, in the fifth embodiment, the identification mark 5 is made of the same material as the protective layer 70. Therefore, the identification mark 5 is formed with the protective layer 70, in the protective layer formation step, on the shield conductor 60. That is, in the fifth embodiment, the identification mark formation step is included in the protective layer formation step. When the identification mark 5 is made of a material different from the protective layer 70, the identification mark formation step is performed separately from the protective layer formation step.

Figure 22:
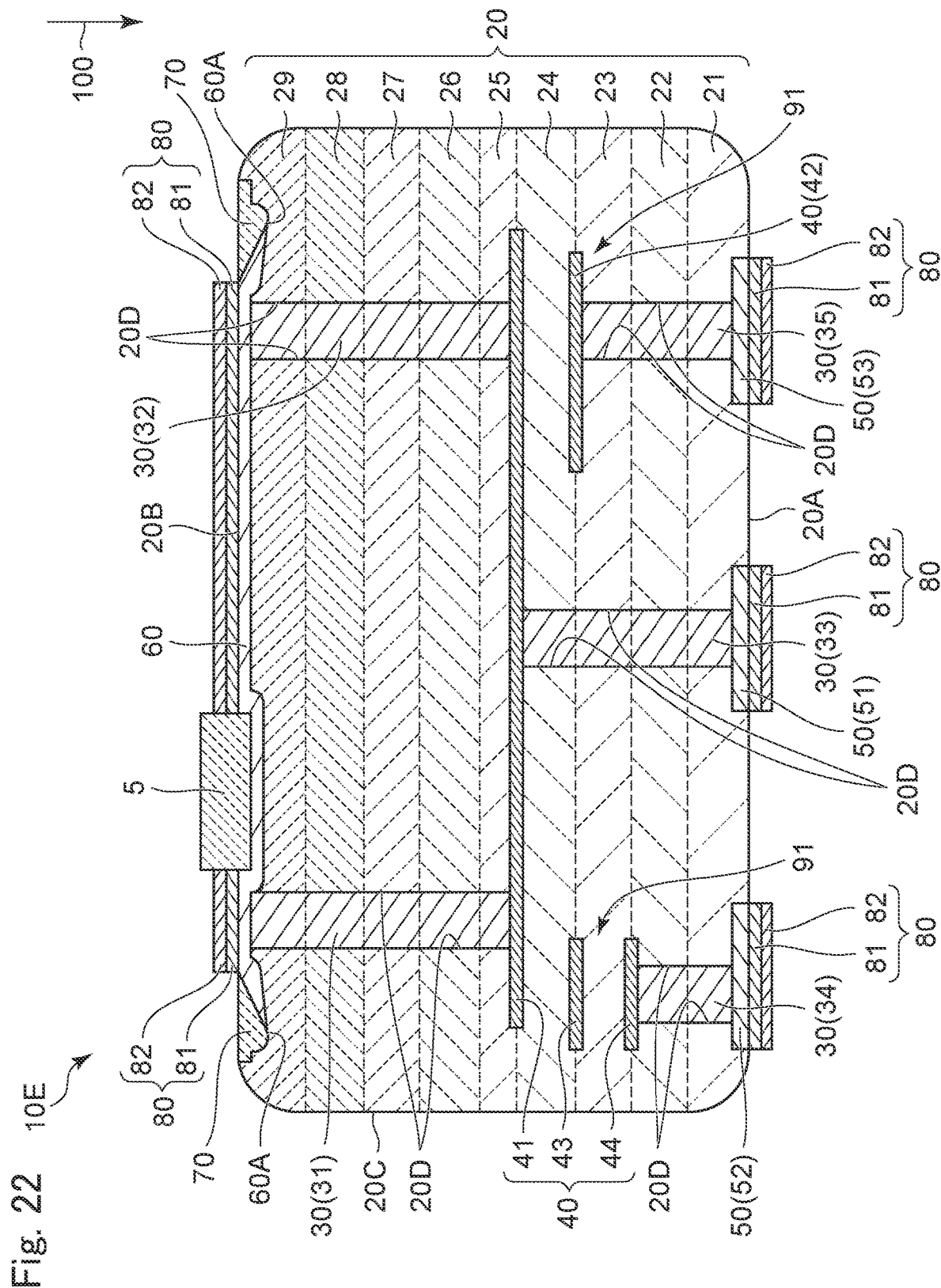
FIG. 22 is a cross-sectional view of an electronic component according to a modification of the fifth embodiment of the present disclosure, taken along a position corresponding to the cross section D-D in FIG. 20.

FIG. 22 is a cross-sectional view of an electronic component according to a modification of the fifth embodiment of the present disclosure, taken along a position corresponding to the cross section D-D in FIG. 20.

In the configuration shown in FIG. 21, the entire identification mark 5 thrusts into the substrate body 20, and the identification mark 5 rests on the bottom of the recess 83 formed by the plating layer 80. However, the identification mark 5 may also be configured to protrude from the plating layer 80, as shown in FIG. 22.

The configuration in which the identification mark 5 protrudes from the plating layer 80 is achieved by forming a thick identification mark 5, in the identification mark formation step. For example, a thick identification mark 5 is formed by printing the mark a plurality of number of times in a manner overlapping each other, in the identification mark formation step.

According to the fifth embodiment, the identification mark 5 is provided on the surface of the shield conductor 60.

Therefore, the visibility of the identification mark 5 can be improved, compared with a configuration in which the identification mark 5 is covered by the shield conductor 60.

If the material of the identification mark 5 is different from the material of the protective layer 70, the process for forming the identification mark 5 on the surface of the shield conductor 60 and the process of forming the protective layer 70 on the surface of the shield conductor 60 are carried out as separate processes. According to the fifth embodiment, by contrast, the identification mark 5 and the protective layer 70 can be formed simultaneously by printing or the like, on the surface of the shield conductor 60. As a result, it is possible to reduce the steps for manufacturing the electronic component 10E.

Sixth Embodiment

FIG. 23 is a cross-sectional view showing a part of an electronic component according to a sixth embodiment of the present disclosure. This electronic component 10F according to the sixth embodiment is different from the electronic component 10 according to the first embodiment in that the protective layer 70 is provided in the central portion, as well as in the outer peripheral portion of the shield conductor 60 provided on the principal surface 20B of the substrate body 20, and that the thickness of the outer peripheral portion of the protective layer 70 is greater than the thickness of the central portion of the protective layer 70. Hereinafter, the difference with respect to the first embodiment will be described. The parts that are the same as those in the electronic component 10 according to the first embodiment are denoted by the same reference numerals, and the description thereof will be basically omitted, and described as necessary.

As shown in FIG. 23, the protective layer 70 provided to the electronic component 10F covers the entire surface of the shield conductor 60 provided on the principal surface 20B of the substrate body 20. The outer peripheral portion of the protective layer 70 in the electronic component 10F has the thickness T1 that is greater than a thickness T3 of the central portion of the protective layer 70 included in the electronic component 10F.

Note that, as long as the protective layer 70 of the electronic component 10F is provided in the central portion of the shield conductor 60, in addition to the outer peripheral portion of the shield conductor 60, the protective layer 70 is not required to cover the entire shield conductor 60 provided on the principal surface 20B of the substrate body 20. For example, as shown in FIG. 15, the protective layer 70 may cover a part (third portion 73) of the central portion of the shield conductor 60, in addition to the outer peripheral portion (the first portion 71, the second portion 72, the fourth portion 74, and the fifth portion 75) of the shield conductor 60.

The configuration in which the outer peripheral portion of the protective layer 70 has a thickness greater than the thickness of the central portion can be achieved by printing, for example, in the protective layer formation step, the protective layer 70 on the outer peripheral portion by a number of times greater than the number of times the protective layer 70 is printed in the central portion.

It is also possible to print the shield conductor 60, in the shield conductor formation step, a larger number of times in the central portion than that the shield conductor 60 is printed on the outer peripheral portion, for example. The resultant thickness of the shield conductor 60 will be greater in the central portion than in the outer peripheral portion of the shield conductor 60. With this, in the next protective layer formation step, a larger amount of paste is laid on the outer peripheral portion of the shield conductor 60. As a result, the outer peripheral portion of the protective layer 70 becomes thicker than the central portion of the protective layer 70.

According to the sixth embodiment, because the outer peripheral portion of the protective layer 70 is thicker than the central portion of the protective layer 70, the outer peripheral portion of the protective layer 70 is enabled to adhere more firmly to the shield conductor 60 and the substrate body 20, than the degree by which the central portion of the protective layer 70 adheres to the shield conductor 60.

When a thicker protective layer 70 is laminated with the substrate body 20 in the lamination step, the protective layer 70 is pressed deeper into the substrate body 20. As a result, the relative distances between the interlayer-connection conductors 30, the internal electrodes 40, the shield conductor 60, and the like provided inside the substrate body 20 change. As a result, a larger amount of noise may enter the internal circuit 90. According to the sixth embodiment, however, the protective layer 70 is thinner in the central portion than in the outer peripheral portion of the protective layer 70. Therefore, the central portion of the protective layer 70 is pressed less in the lamination step, so that it is possible to suppress such noise.

When the protective layer 70 covers the entire shield conductor 60 provided on the principal surface 20B of the substrate body 20, as in the sixth embodiment, the following effects can be achieved. Because the plating layer 80 covering the shield conductor 60 is rendered unnecessary, cost reductions can be achieved. Furthermore, the adhesiveness of the shield conductor 60 to the substrate body 20 can be enhanced. Still furthermore, the risk of the shield conductor 60 peeling off from the substrate body 20 can be reduced.

Note that by using an appropriate combination of any of the various embodiments described above, it is possible to achieve the advantageous effects corresponding to the combined embodiments.

Although the present disclosure has been fully described in connection with the preferred embodiments thereof with reference to the drawings as appropriate, it is to be noted that various changes and modifications are apparent to those skilled in the art. Such variations and modifications are to be understood as falling within the scope of the present disclosure, as set forth in the appended claims.

5 identification mark
10 electronic component
20 substrate body
20A principal surface
20B principal surface
20C side surface
21 substrate
22 substrate
23 substrate
24 substrate
25 substrate
26 substrate
27 substrate
28 substrate
29 substrate
30 interlayer-connection conductor
42 internal electrode (inductor conductor)
43 internal electrode (capacitor conductor)
44 internal electrode (capacitor conductor)
52 external electrode (electrode)

53 external electrode (electrode)
60 shield conductor
60A interface
60Aa interface (first interface)
60Ab interface (second interface)
60D outer peripheral portion
70 protective layer
71 first portion
72 second portion
73 third portion
90 internal circuit
91 LC resonator
100 thickness direction

The invention claimed is:

1. An electronic component comprising:
a substrate body including a plurality of substrates being insulating and laminated in a thickness direction, and having a pair of principal surfaces facing each other and a side surface connecting the pair of principal surfaces;
an LC resonator including an inductor conductor disposed on at least one of the plurality of substrates, and a capacitor conductor disposed on at least one of the plurality of substrates and electrically connected to the inductor conductor;
a shield conductor disposed on at least one principal surface, among the pair of principal surfaces and the side surface, and electrically connected to a ground;
an electrode disposed on at least one of another one of the pair of principal surfaces and the side surface, and electrically connected to the LC resonator; and
a protective layer covering at least a part of the shield conductor disposed on the one principal surface, out of the pair of principal surfaces, and also covering at least a part of the one principal surface, in a manner straddling at least a part of an interface between an outer peripheral portion of the shield conductor disposed on the one principal surface and the substrate body, in a view from a thickness direction,
wherein the protective layer is provided on the outer peripheral portion of the shield conductor and a central portion of the shield conductor in a view from the thickness direction, the central portion being on an inner side of the outer peripheral portion of the shield conductor in a view from the thickness direction, and
the protective layer provided on the outer peripheral portion of the shield conductor has a thickness greater than a thickness of the protective layer provided at the central portion of the shield conductor.

2. The electronic component according to claim 1, wherein
the part of the shield conductor, the part being covered by the protective layer, is nipped between the protective layer and the substrate body, in an internal portion of the substrate body.

3. The electronic component according to claim 1, wherein
the interface between the shield conductor disposed on the one principal surface and the substrate body comprises a first interface, and a second interface with the shield conductor between the first interface and the second interface in a view from the thickness direction, and wherein
the protective layer comprises
a first portion straddling the first interface,
a second portion straddling the second interface, and
a third portion connecting the first portion and the second portion in a manner of traversing across the shield conductor between the first interface and the second interface, in a view from the thickness direction.

4. The electronic component according to claim 1, further comprises
at least one interlayer-connection conductor penetrating the substrate on which the shield conductor is disposed, among the plurality of substrates, wherein
the shield conductor is electrically connected to the ground via the interlayer-connection conductor.

5. The electronic component according to claim 1, wherein
the at least one interlayer-connection conductor comprises a plurality of interlayer-connection conductors, wherein
the shield conductor is electrically connected to the ground via the plurality of interlayer-connection conductors.

6. The electronic component according to claim 4, wherein
at least one of the interlayer-connection conductor is positioned in an outer peripheral portion of the shield conductor, in a view from the thickness direction, and wherein
the protective layer is disposed at a position overlapping with at least a part of the interlayer-connection conductor in a manner straddling the interlayer-connection conductor and the shield conductor, in a view from the thickness direction.

7. The electronic component according to claim 1, wherein
the shield conductor is provided on one of the pair of principal surfaces, without providing the shield conductor on the other one of the pair of principal surfaces and the side surfaces.

8. The electronic component according to claim 1, wherein
an internal circuit comprising the LC resonator is provided on at least one of the plurality of substrates, and wherein
the protective layer is provided, in a view in the thickness direction, at a position offset from a closest element of the internal circuit, the closest element being closest in the thickness direction to one of the pair of principal surfaces.

9. The electronic component according to claim 1, further comprising
an identification mark provided on a surface of the shield conductor provided on the one principal surface, out of the pair of principal surfaces.

10. The electronic component according to claim 9, wherein
the identification mark comprises a material being the same as a material of the protective layer.

11. The electronic component according to claim 1, wherein
at least a part of the protective layer provided in a neighboring portion around the interface between the shield conductor disposed on the one principal surface and the substrate body in a view from the thickness direction is thicker in the thickness direction than the shield conductor provided on one of the pair of principal surfaces.

12. The electronic component according to claim 2, wherein the interface between the shield conductor disposed on the one principal surface and the substrate body comprises a first interface, and a second interface with the shield conductor between the first interface and the second interface in a view from the thickness direction, and wherein the protective layer comprises a first portion straddling the first interface, a second portion straddling the second interface, and a third portion connecting the first portion and the second portion in a manner of traversing across the shield conductor between the first interface and the second interface, in a view from the thickness direction.

13. The electronic component according to claim 2, further comprises at least one interlayer-connection conductor penetrating the substrate on which the shield conductor is disposed, among the plurality of substrates, wherein the shield conductor is electrically connected to the ground via the interlayer-connection conductor.

14. The electronic component according to claim 3, further comprises at least one interlayer-connection conductor penetrating the substrate on which the shield conductor is disposed, among the plurality of substrates, wherein the shield conductor is electrically connected to the ground via the interlayer-connection conductor.

15. The electronic component according to claim 2, wherein the at least one interlayer-connection conductor comprises a plurality of interlayer-connection conductors, wherein the shield conductor is electrically connected to the ground via the plurality of interlayer-connection conductors.

16. The electronic component according to claim 3, wherein the at least one interlayer-connection conductor comprises a plurality of interlayer-connection conductors, wherein the shield conductor is electrically connected to the ground via the plurality of interlayer-connection conductors.

17. The electronic component according to claim 4, wherein the at least one interlayer-connection conductor comprises a plurality of interlayer-connection conductors, wherein the shield conductor is electrically connected to the ground via the plurality of interlayer-connection conductors.

18. The electronic component according to claim 5, wherein at least one of the interlayer-connection conductor is positioned in an outer peripheral portion of the shield conductor, in a view from the thickness direction, and wherein the protective layer is disposed at a position overlapping with at least a part of the interlayer-connection conductor in a manner straddling the interlayer-connection conductor and the shield conductor, in a view from the thickness direction.

19. The electronic component according to claim 2, wherein the shield conductor is provided on one of the pair of principal surfaces, without providing the shield conductor on the other one of the pair of principal surfaces and the side surfaces.

20. The electronic component according to claim 3, wherein the shield conductor is provided on one of the pair of principal surfaces, without providing the shield conductor on the other one of the pair of principal surfaces and the side surfaces.

* * * * *